(12) United States Patent
Fukunaka

(10) Patent No.: US 11,316,071 B2
(45) Date of Patent: Apr. 26, 2022

(54) OPTICAL DEVICE AND METHOD FOR MANUFACTURING OPTICAL DEVICE

(71) Applicant: ASAHI KASEI MICRODEVICES CORPORATION, Tokyo (JP)

(72) Inventor: Toshiaki Fukunaka, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 237 days.

(21) Appl. No.: 16/783,932

(22) Filed: Feb. 6, 2020

(65) Prior Publication Data

US 2020/0259049 A1 Aug. 13, 2020

(30) Foreign Application Priority Data

Feb. 8, 2019 (JP) .............. JP2019-021755
Jan. 21, 2020 (JP) .............. JP2020-007813

(51) Int. Cl.
*H01L 33/38* (2010.01)
*G02B 6/42* (2006.01)

(52) U.S. Cl.
CPC .......... *H01L 33/387* (2013.01); *G02B 6/4245* (2013.01)

(58) Field of Classification Search
CPC .................. H01L 33/387; G02B 6/4245
See application file for complete search history.

(56) References Cited

U.S. PATENT DOCUMENTS

| 8,211,750 B2 | 7/2012 | Ohsumi |
| 9,691,932 B2 | 6/2017 | Sasaki et al. |
| 2006/0065964 A1 | 3/2006 | Ohsumi |
| 2009/0053856 A1 | 2/2009 | Ohsumi |
| 2012/0302124 A1 | 11/2012 | Imazu |
| 2016/0079464 A1 | 3/2016 | Sasaki et al. |
| 2017/0236981 A1* | 8/2017 | Nakabayashi .......... H01L 33/60 438/29 |
| 2017/0294408 A1* | 10/2017 | Happoya ............... H01L 24/29 |

(Continued)

FOREIGN PATENT DOCUMENTS

| JP | 2004-363279 A | 12/2004 |
| JP | 2006-128625 A | 5/2006 |
| JP | 2008-130721 A | 6/2008 |

(Continued)

*Primary Examiner* — Mark W Tornow
(74) *Attorney, Agent, or Firm* — Morgan, Lewis & Bockius LLP

(57) ABSTRACT

Provided are an optical device that is a small and thin optical device including a redistribution layer and has high light emitting efficiency and light receiving efficiency, and a method for manufacturing the optical device. An optical device includes: a photoelectric conversion element configured to include a semiconductor substrate, a semiconductor layer capable of receiving or emitting light, and electrodes; a sealing portion configured to expose a surface of the photoelectric conversion element on the opposite side to an electrode-formed surface of the photoelectric conversion element on which the electrodes are formed; a redistribution layer configured to include a reflecting portion disposed in a region in which, when viewed in plan, the semiconductor layer and the electrodes do not overlap each other and configured to reflect the light to a side on which the semiconductor layer is located; and external connection terminals configured to be coupled to the redistributions.

14 Claims, 15 Drawing Sheets

(56) References Cited

U.S. PATENT DOCUMENTS

2018/0082990 A1* 3/2018 Furuyama ........... H01L 31/0203

FOREIGN PATENT DOCUMENTS

| | | |
|---|---|---|
| JP | 2011-249419 A | 12/2011 |
| JP | 2016-027586 A | 2/2016 |
| JP | 2016-062996 A | 4/2016 |
| JP | 2018-037638 A | 3/2018 |
| JP | 2018-049892 A | 3/2018 |
| WO | 2011/093454 A1 | 8/2011 |

* cited by examiner

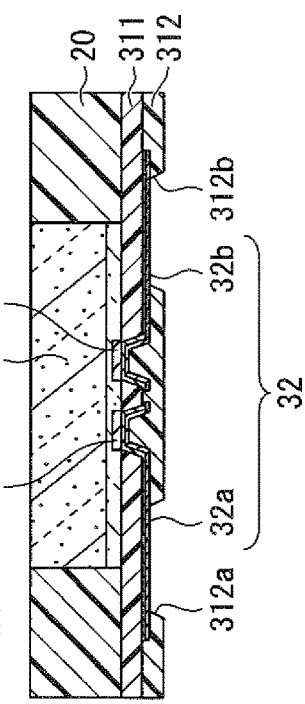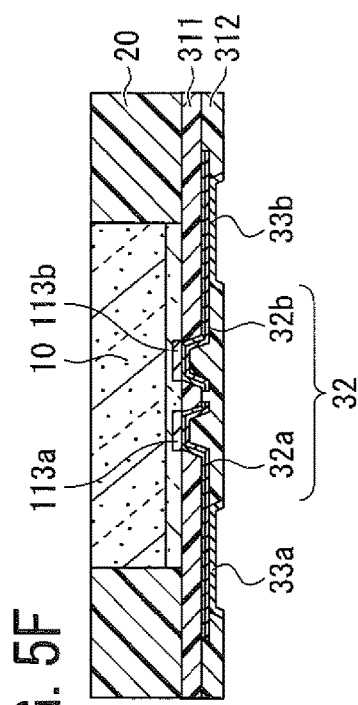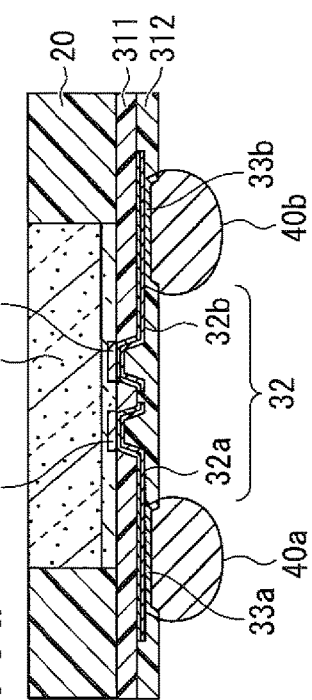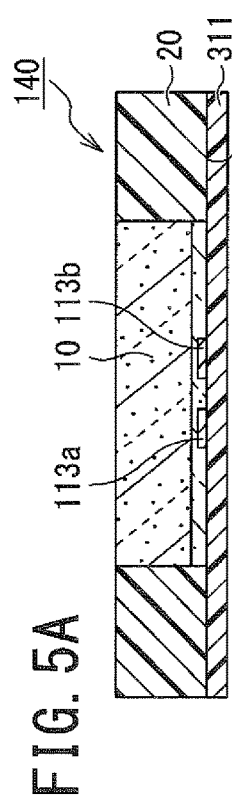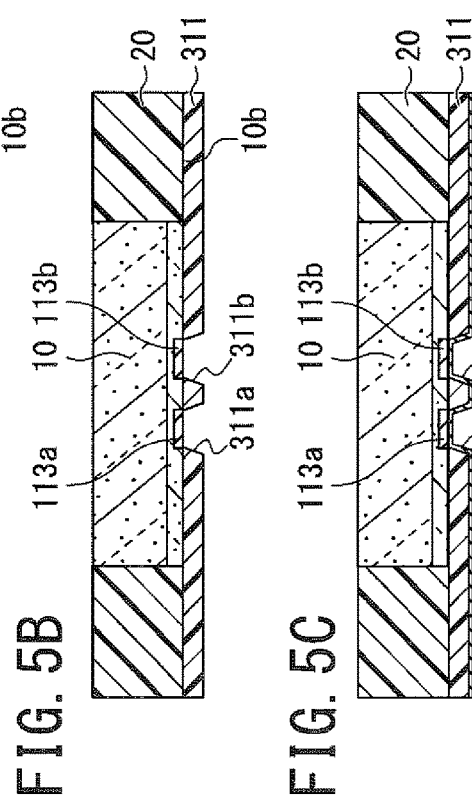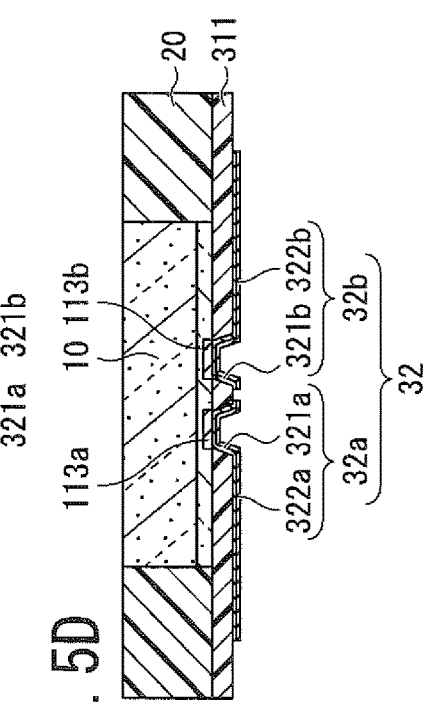

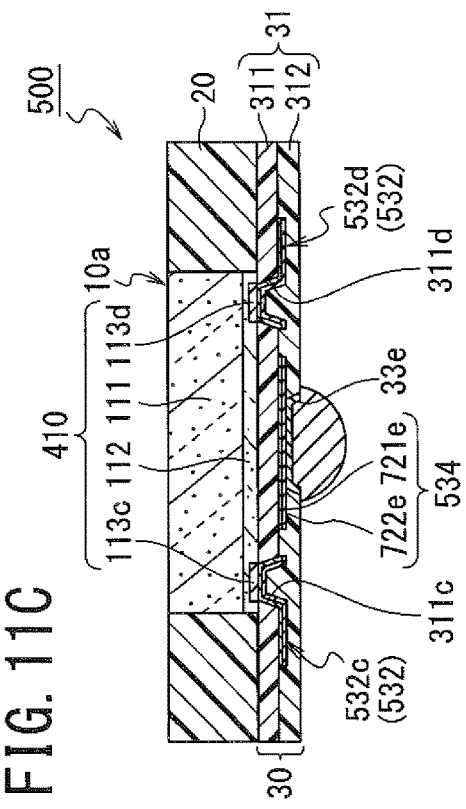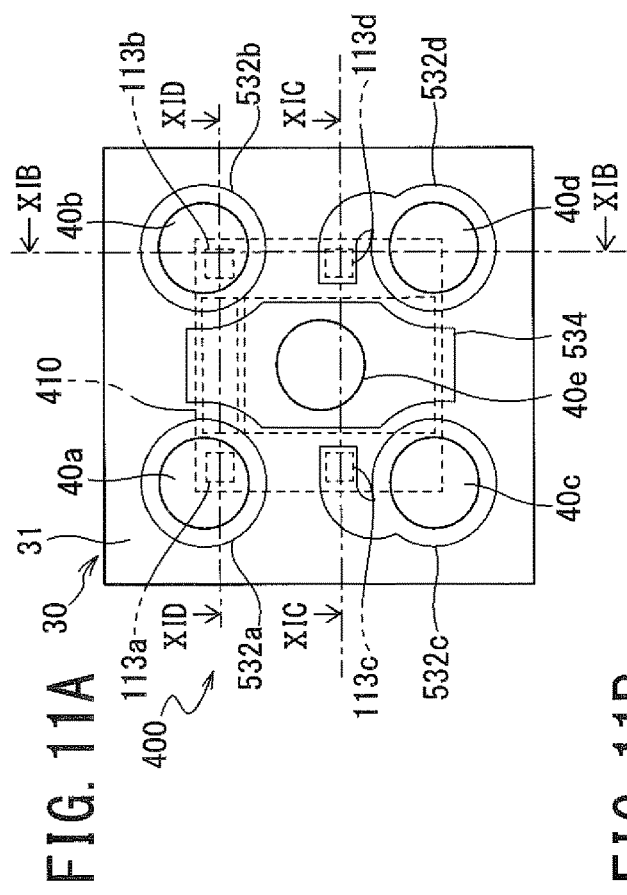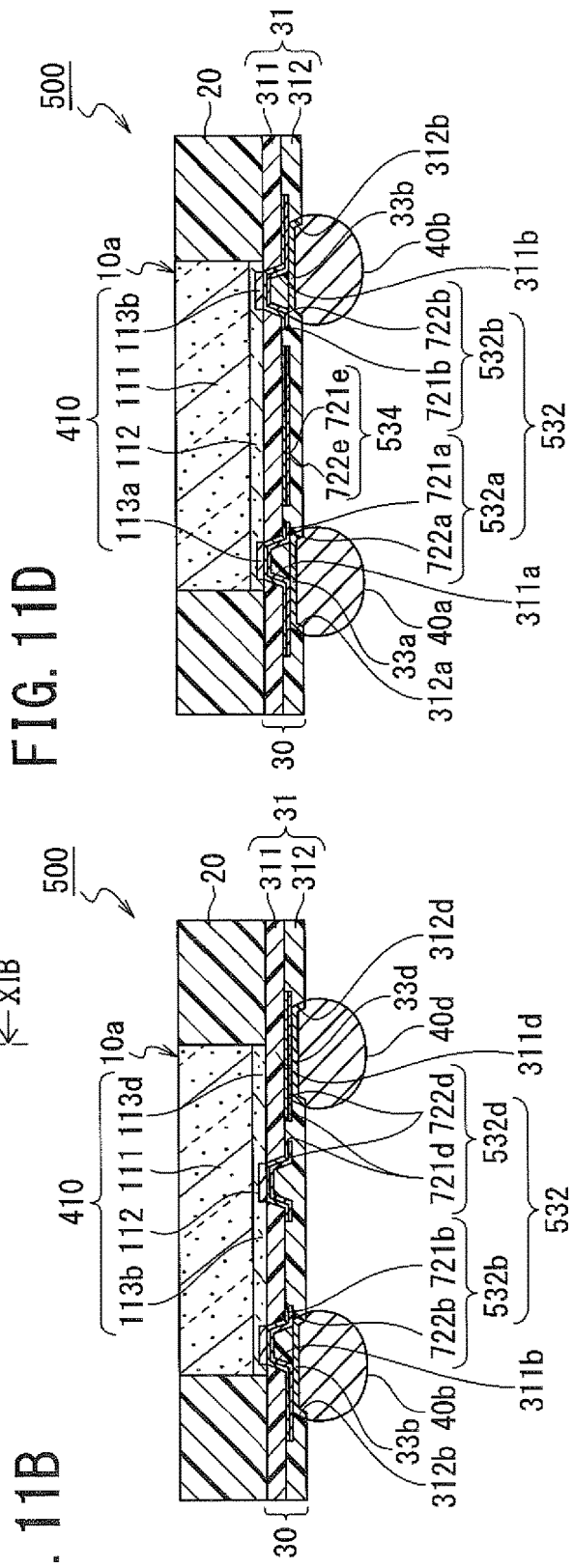

OPTICAL DEVICE AND METHOD FOR MANUFACTURING OPTICAL DEVICE

TECHNICAL FIELD

The present invention relates to an optical device, such as an infrared device, and a method for manufacturing the optical device.

BACKGROUND ART

Conventionally, in order to attain high luminance and miniaturization of a light emitting device, a configuration in which an electrode layer that is a reflecting layer reflecting light from a light emitting layer is formed on a surface of a light emitting element on the opposite side to a light emitting surface thereof, using a metal, such as copper, and a protruding electrode that is an external terminal is formed directly on the electrode layer has been proposed (see JP 2008-130721 A).

SUMMARY

However, the configuration described above cannot be applied to a small and thin semiconductor package including a redistribution layer, such as a so-called fan out wafer level package (FOWLP).

The present invention has been made in consideration of the above-described problem and an object of the present invention is to obtain an optical device that is a small and thin optical device including a redistribution layer and the light emitting efficiency and light receiving efficiency of which are improved, and a method for manufacturing the optical device.

In order to achieve the above-described object, an optical device according to one aspect of the present invention is characterized by including a photoelectric conversion element configured to include a semiconductor substrate, a semiconductor layer formed on one principal surface of the semiconductor substrate and capable of receiving or emitting light, and electrodes formed on the semiconductor layer; a sealing portion configured to cover a side surface of the photoelectric conversion element in such a way as to expose a surface of the photoelectric conversion element on the opposite side to an electrode-formed surface of the photoelectric conversion element on which the electrodes are formed; a redistribution layer configured to include an insulating layer disposed on the electrode-formed surface of the photoelectric conversion element, redistributions coupled to the electrodes, and a reflecting portion disposed in a region in which, when viewed in plan, the semiconductor layer and the electrodes do not overlap each other and configured to reflect the light to a side on which the semiconductor layer is located; and external connection terminals configured to be disposed on the redistribution layer and coupled to the redistributions.

In addition, a method for manufacturing an optical device according to an aspect of the present invention is characterized by including: forming a first insulating layer on a surface on an electrode side of a photoelectric conversion element configured to include a semiconductor substrate, a semiconductor layer formed on one principal surface of the semiconductor substrate and capable of receiving or emitting light, and electrodes formed on the semiconductor layer in such that the electrodes are exposed; forming a redistribution layer electrically coupled to the electrodes, and a reflecting portion on a region in which, when viewed in plan, the semiconductor layer and the electrodes do not overlap each other; forming a second insulating layer in such that portions of the redistribution layer are exposed; and forming external connection terminals on the exposed portions of the redistribution layer.

According to one aspect of the present invention, it is possible to obtain an optical device that is a small and thin optical device including a redistribution layer and the light emitting efficiency and light receiving efficiency of which are improved, and a method for manufacturing the optical device.

BRIEF DESCRIPTION OF DRAWINGS

FIGS. 5A to 5G are process cross-sectional views illustrative of the other manufacturing processes of the optical device according to the first embodiment of the present invention;

FIGS. 11A to 11D are schematic views illustrative of a configuration example of an optical device according to a fifth embodiment of the present invention;

DESCRIPTION OF EMBODIMENTS

Hereinafter, the present invention will be described through some embodiments. It should be, however, noted that the following embodiments do not limit the present invention according to the claims. Additionally, all of combinations of features described in the embodiments are not necessarily essential for solving means of the present invention.

Each embodiment of the present invention will be described hereinbelow with reference to the drawings.

1. First Embodiment

Hereinafter, a configuration of an optical device according to a first embodiment and a method for manufacturing the optical device will be described using FIGS. 1A to 6G. The optical device according to the first embodiment includes a photoelectric conversion element including a light receiving portion configured to detect light, such as infrared rays. The optical device according to the first embodiment is used as, for example, a human sensor that detects presence of a human by means of detecting light, such as infrared rays, or a gas sensor using a non-dispersive infrared (NDIR) method.

Configuration of Optical Device

Figure 1A:
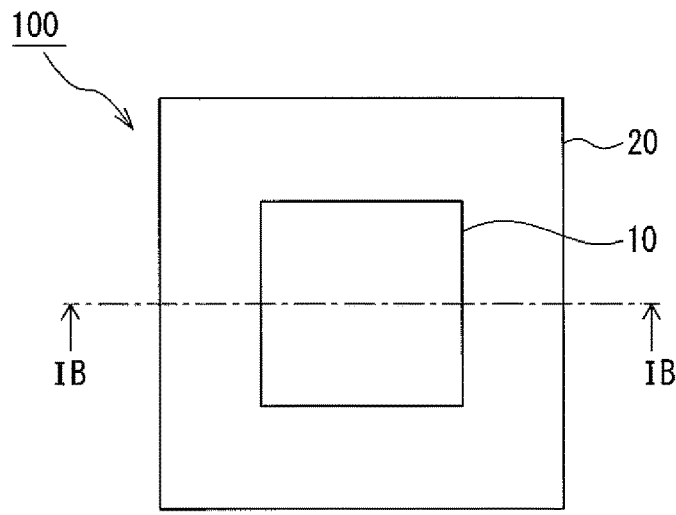
FIGS. 1A to 1C are schematic views illustrative of a configuration example of an optical device according to a first embodiment of the present invention.
Figure 1B:
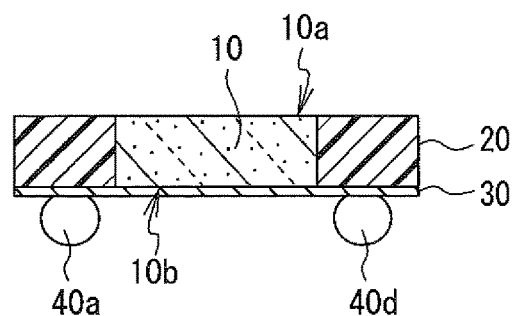
Figure 1C:
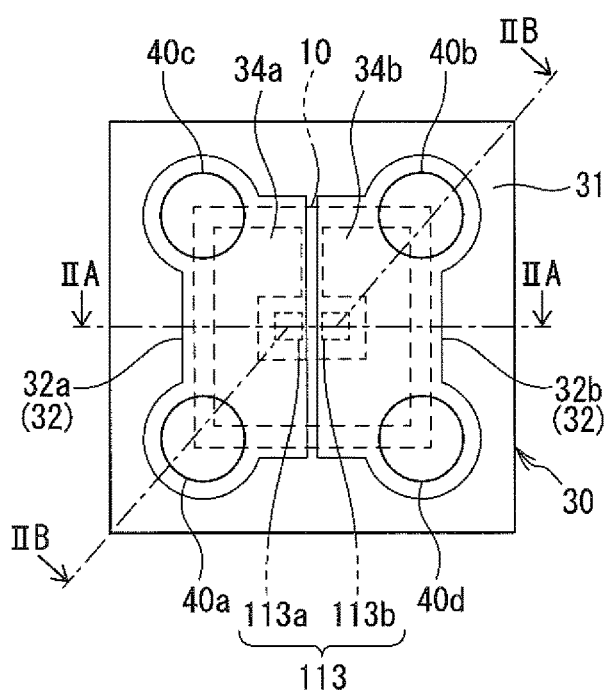
Figure 2A:
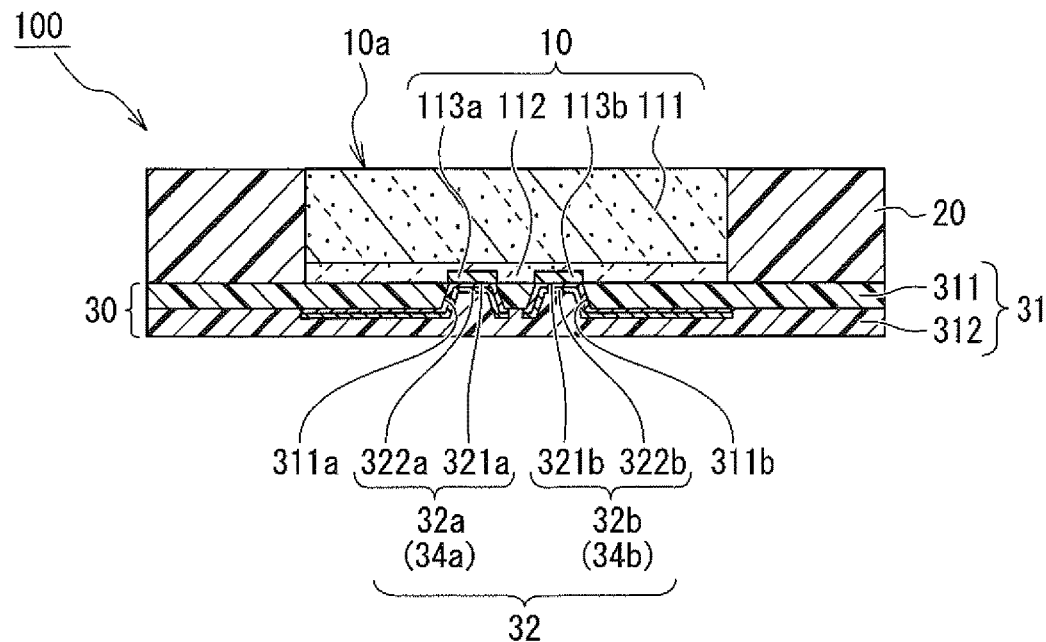
FIGS. 2A and 2B are cross-sectional views illustrative in detail of cross-sections taken along the lines IIA-IIA and IIB-IIB of FIG. 1C.
Figure 2B:
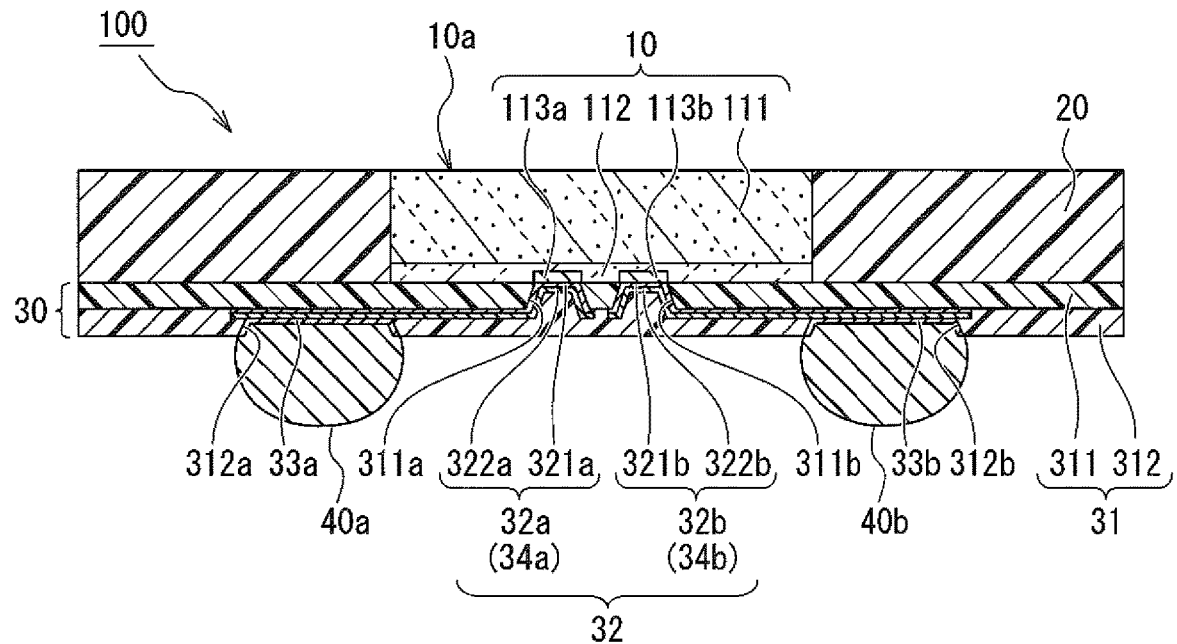
Figure 3:
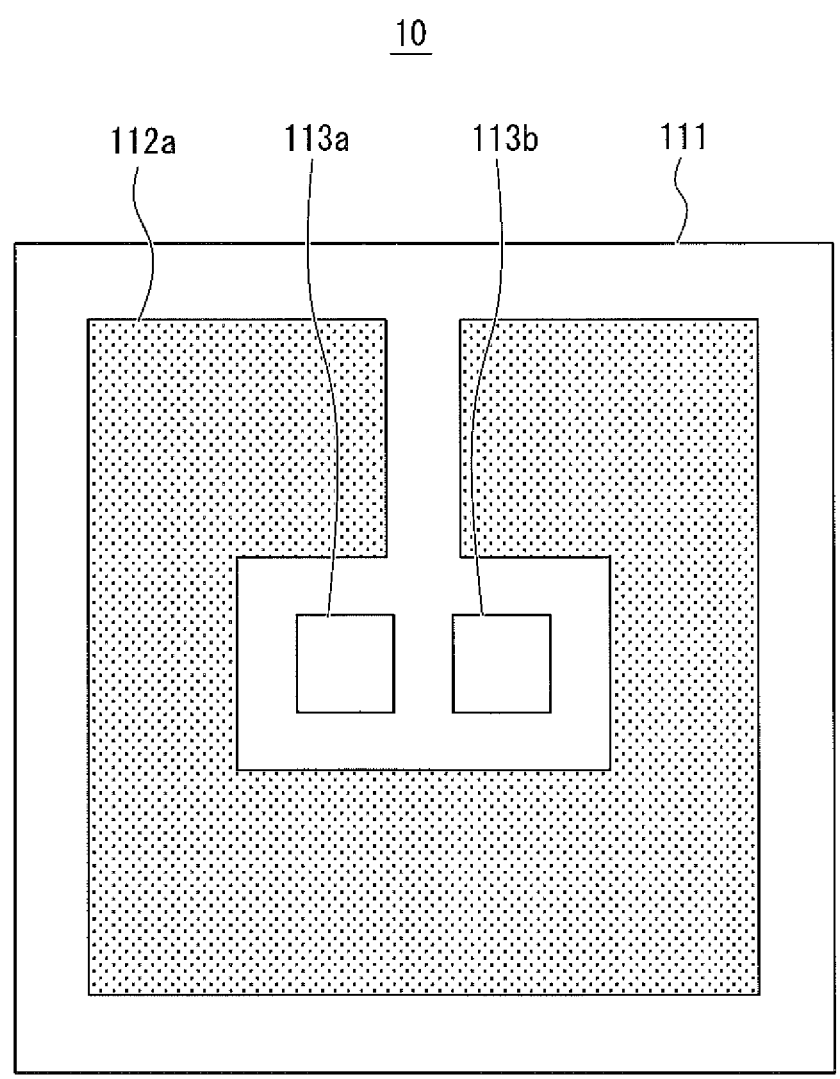
FIG. 3 is a schematic diagram illustrative of a configuration of a light receiving portion and electrodes of a photoelectric conversion element that is used in the optical device according to the first embodiment of the present invention.

FIGS. 1A to 1C are configuration diagrams for a description of an optical device 100 according to the first embodiment, and FIGS. 1A, 1B, and 1C are a plan view illustrative of a configuration example of the optical device 100, a cross-sectional view schematically illustrative of a cross-section taken along the line IB-IB of FIG. 1A, and a bottom view illustrative of the configuration example of the optical device 100, respectively. FIGS. 2A and 2B are cross-sectional views illustrative of cross-sectional configurations of the optical device 100 in detail, and FIGS. 2A and 2B are a cross-sectional view of the optical device 100 in a cross-section taken along the line IIA-IIA of FIG. 1C and a cross-sectional view of the optical device 100 in a cross-section taken along the line IIB-IIB of FIG. 1C, respectively. FIG. 3 is illustrative of a configuration of a light receiving portion 112a and electrodes 113a and 113b of a photoelectric conversion element 10 that the optical device 100 includes. FIG. 2B is a cross-sectional view illustrated in such a manner that the bottom surface of the optical device 100 faces downward.

In the present embodiment, description will be made assuming a surface at which the optical device 100 is coupled to a not-illustrated circuit board (a surface on which external connection terminals are formed) to be the bottom surface of the optical device 100 and a surface (light incident surface) on the opposite side to the surface on which the external connection terminals are formed to be the upper surface of the optical device 100.

As illustrated in FIGS. 1A to 1C, the optical device 100 includes the photoelectric conversion element 10, a sealing portion 20 sealing a portion of the photoelectric conversion element 10, a redistribution layer 30 electrically coupled to the photoelectric conversion element 10, and a plurality of external connection terminals 40 (in FIG. 1C, four external connection terminals 40a to 40d) electrically coupled to the redistribution layer 30.

From the upper surface of the optical device 100, a light incident surface 10a that serves as a surface where light is incident on the photoelectric conversion element 10 is exposed. In the present embodiment, an example in which, from the upper surface of the optical device 100 illustrated in FIGS. 1A and 1B, the light incident surface 10a of the photoelectric conversion element 10 is exposed is described.

As illustrated in FIGS. 2A and 2B, on the surface of the photoelectric conversion element 10 on the opposite side to the light incident surface 10a thereof, the electrodes 113a and 113b are disposed. The surface (electrode-formed surface 10b) of the photoelectric conversion element 10 on which the electrodes 113a and 113b are formed is in close contact with the redistribution layer 30. The photoelectric conversion element 10 is electrically coupled to the redistribution layer 30 via the electrodes 113a and 113b.

Hereinafter, respective portions of the optical device 100 will be described in detail.

Photoelectric Conversion Element

The photoelectric conversion element 10 according to the first embodiment includes a semiconductor substrate 111, a semiconductor layer 112 formed on one principal surface (the lower surface illustrated in FIGS. 2A and 2B) of the semiconductor substrate 111, and electrodes 113 (113a and 113b) formed on the semiconductor layer 112. When the photoelectric conversion element 10 is a light receiving element, the semiconductor layer 112 includes the light receiving portion 112a capable of receiving light, as illustrated in FIG. 3. The photoelectric conversion element 10 receives light from the outside at the light receiving portion 112a through the semiconductor substrate 111. When the photoelectric conversion element 10 is a light emitting element, the semiconductor layer 112 includes a light emitting portion capable of generating light. The photoelectric conversion element 10 emits generated light to the outside through the semiconductor substrate 111. Although, hereinafter, description will be made, partially using, as an example, a case where the photoelectric conversion element 10 is a light receiving element, the optical device of the present embodiment is not limited to the case and includes a case where the photoelectric conversion element 10 is a light emitting element. When the photoelectric conversion element 10 is a light emitting element, the same description applies to the case with the term "incidence" replaced with the term "emission" and the expression "light reception" replaced with the expression "light emission".

The photoelectric conversion element 10 may have an antireflection coating on the light incident surface 10a side of the semiconductor substrate 111. The antireflection coating suppresses light incident on the photoelectric conversion element 10 from the outside of the photoelectric conversion element 10 from being reflected by the surface of the photoelectric conversion element 10 and thereby improves light incidence efficiency. The antireflection coating has translucency and is, for example, a single layer film made of titanium dioxide ($TiO_2$), silicon dioxide ($SiO_2$), silicon nitride ($Si_3N_4$), diamond-like carbon (DLC), or the like or a stacked film made by stacking some of these materials.

Semiconductor Substrate

The semiconductor substrate 111 is a substrate on which the semiconductor layer 112 having a PN junction or PIN junction photodiode structure can be formed. The semiconductor substrate 111 is not limited to a specific type as long as having optical transparency with respect to light intended to be detected, such as infrared rays. The semiconductor substrate 111 may be either a substrate having materials including a semiconductor or an insulating substrate. That is, the "semiconductor substrate" means a substrate constituting the photoelectric conversion element 10 functioning as a semiconductor element. Examples of the semiconductor substrate 111 include a substrate formed of silicon (Si), gallium arsenide (GaAs), sapphire, indium phosphide (InP), or the like.

When the semiconductor layer 112 is formed of a material including a narrow-gap semiconductor material including In, Sb, As, Al, or the like (for example, InSb), it is preferable to use a GaAs substrate as the semiconductor substrate 111 from the viewpoint of forming the semiconductor layer 112 having fewer lattice defects. In this case, the semiconductor substrate 111 has high transmittance for light, and it becomes possible to obtain high quality crystalline growth on the semiconductor substrate 111.

Semiconductor Layer

The semiconductor layer 112 has a PIN junction photodiode structure constituted by a first conductivity type semiconductor layer, an active layer, and a second conductivity type semiconductor layer (not illustrated). The semiconductor layer 112 is not limited to the structure in the present embodiment as long as being a semiconductor layer having a PN junction or PIN junction photodiode structure. In addition, the semiconductor layer 112 may have a PN junction photodiode structure constituted by a first conductivity type semiconductor layer and a second conductivity type semiconductor layer. To the semiconductor layer 112, any known substance having a sensitivity for light with a specific wavelength, such as infrared rays, can be applied, and, for example, a semiconductor layer including InSb can be applied.

Electrode

The electrodes 113 include the electrodes 113a and 113b, which are formed on the semiconductor layer 112. The electrode 113a is electrically coupled to the first conductivity type semiconductor layer of the semiconductor layer 112. The electrode 113b is electrically coupled to the second conductivity type semiconductor layer of the semiconductor layer 112.

The electrodes 113a and 113b are not limited to a specific type as long as being made of a material by which electrical contact with the semiconductor layer 112 can be made. A portion of light incident from the semiconductor substrate 111 side is reflected by the electrodes 113a and 113b. Thus, covering the semiconductor layer 112 with the electrodes 113a and 113b with large area has an effect of increasing light receiving efficiency and light emitting efficiency. On the other hand, covering the semiconductor layer 112 with the electrodes 113a and 113b with large area increases constraint on the layout of the photoelectric conversion element 10, which causes an increase in the chip size of the photoelectric conversion element 10.

Sealing Portion

The sealing portion 20 is formed of a resin material and covers the side surfaces of the photoelectric conversion element 10 in such a way as to expose the light incident surface 10a of the photoelectric conversion element 10. The sealing portion 20 covering the side surfaces of the photoelectric conversion element 10 exposes the electrode-formed surface 10b of the photoelectric conversion element 10 to the redistribution layer 30. That is, in the optical device 100 according to the present embodiment, the photoelectric conversion element 10 illustrated in FIGS. 2A and 2B except the upper surface (the light incident surface 10a) and the bottom surface (the electrode-formed surface 10b) is covered by the sealing portion 20. Note that the sealing portion 20 only has to be formed in such that light, such as infrared rays, can be incident on the semiconductor layer 112 through the semiconductor substrate 111, and which surface of the photoelectric conversion element 10 is covered is not specifically limited. For example, the sealing portion 20 may cover a portion of the electrode-formed surface 10b of the photoelectric conversion element 10 or a portion of the surface of the photoelectric conversion element 10 on the opposite side to the electrode-formed surface 10b and does not have to cover a portion of the side surfaces of the photoelectric conversion element 10. In addition, an optical device of another embodiment does not have to include a sealing portion 20.

For the sealing portion 20, from the viewpoint of mass productivity, mechanical strength, and stress exerted on the photoelectric conversion element 10, it is preferable to use a resin material having a linear expansion coefficient close to a linear expansion coefficient of a material of which redistributions 32 and reflecting portions 34a and 34b that the redistribution layer 30 includes are formed. The sealing portion 20 is formed of a resin material, such as an epoxy resin, that is used in general semiconductor devices.

In addition, a material of which the sealing portion 20 is formed may include, in addition to a resin material, such as an epoxy resin, filler or impurities that are inevitably mixed in. As the filler, silica, alumina, or the like is suitably used. The amount of mixed filler occupies, of the material of which the sealing portion 20 is formed, preferably 50% by volume or greater and 99% by volume or less, more preferably 70% by volume or greater and 99% by volume or less, and furthermore preferably 85% by volume or greater and 99% by volume or less.

Redistribution Layer

The redistribution layer 30 is formed on the electrode-formed surface 10b side of the photoelectric conversion element 10. The redistribution layer 30 of the optical device 100 illustrated in FIGS. 2A and 2B includes insulating layers 31 including a first insulating layer 311 and a second insulating layer 312, the redistributions 32, the reflecting portions 34a and 34b configured to reflect light from the photoelectric conversion element 10 to the side on which the semiconductor layer 112 is located, and pads 33a to 33d for coupling external connection terminals 40a to 40d. The redistributions 32 include a first redistribution 32a and a second redistribution 32b. The redistributions 32 are electrically coupled to the electrodes 113a and 113b of the photoelectric conversion element 10.

As illustrated in FIG. 1C, in the photoelectric conversion element 10 of the present embodiment, to the electrode 113a and the electrode 113b, the first redistribution 32a and the second redistribution 32b are coupled, respectively. In addition, the first redistribution 32a and the second redistribution 32b are coupled to the external connection terminals 40a and 40c and the external connection terminals 40b and 40d, respectively. Hereinafter, when the whole of the first redistribution 32a and the second redistribution 32b included in the redistribution layer 30 is described, the first redistribution 32a and the second redistribution 32b are sometimes collectively referred to as the redistributions 32. The redistributions 32 may be formed in one layer or formed over a plurality of layers.

First Insulating Layer

The first insulating layer 311 is an insulating layer formed on the electrode-formed surface 10b side of the photoelectric conversion element 10 and sealing portion 20. The first insulating layer 311 is formed of a material that does not tend to warp, has excellence in junction characteristics with the first redistribution 32a, the second redistribution 32b, and the reflecting portions 34a and 34b, and has high heat resistance and is formed of, for example, a resin material, such as polyimide. The first insulating layer 311 has openings 311a and 311b that penetrate the first insulating layer 311 at positions of the electrodes 113a and 113b of the photoelectric conversion element 10, respectively. This configuration enables, as illustrated in FIG. 2A, the first redistribution 32a and the second redistribution 32b to be electrically coupled to the electrode 113a and the electrode 113b via the openings 311a and 311b, respectively.

Redistribution and Reflecting Portion

The first redistribution 32a and the second redistribution 32b electrically couple the electrodes 113a and 113b of the photoelectric conversion element 10 to the external connection terminals 40a to 40d. The redistributions 32 (the first redistribution 32a and the second redistribution 32b) are disposed between the first insulating layer 311 and the second insulating layer 312. The first redistribution 32a covers a surface of the electrode 113a that is exposed from the opening 311a of the first insulating layer 311 and the sidewall of the opening 311a and extends on a surface of the first insulating layer 311 from the sidewall of the opening 311a to the pads 33a and 33c (the pad 33c is not illustrated). The second redistribution 32b covers a surface of the electrode 113b that is exposed from the opening 311b of the first insulating layer 311 and the sidewall of the opening 311b and extends on a surface of the first insulating layer 311 from the sidewall of the opening 311b to the pads 33b and 33d (the pad 33d is not illustrated). Note that the pads 33 are members that electrically couple the external connection terminals 40 to the redistributions 32.

The reflecting portions 34a and 34b are disposed in regions in which, when the optical device 100 is viewed in plan, the semiconductor layer 112 and the electrodes 113a and 113b do not overlap each other. As illustrated in FIG. 1C, in the photoelectric conversion element 10 of the optical device 100 of the present embodiment, the reflecting portion 34a is formed in such a way as to be a portion of the first redistribution 32a, that is, the reflecting portion 34a is formed integrally with the first redistribution 32a. Similarly, the reflecting portion 34b is formed in such a way as to be a portion of the second redistribution 32b, that is, the reflecting portion 34b is formed integrally with the second redistribution 32b. For this reason, the reflecting portions 34a and 34b also function as the first redistribution 32a and the second redistribution 32b, respectively, and the first redistribution 32a and the second redistribution 32b also function as the reflecting portions 34a and 34b, respectively.

In the photoelectric conversion element 10 of the optical device 100 of the present embodiment, the reflecting portion 34a, which is a portion of the first redistribution 32a, is formed into, when viewed in plan, a shape that covers approximately a half of the semiconductor layer 112 (approximately a left half of the light receiving portion 112a illustrated in FIG. 3) and the circumference of which curves along the outer shapes of the external connection terminals 40a and 40c around peripheries of the external connection terminals 40a and 40c (FIG. 1C). In addition, the reflecting portion 34b, which is a portion of the second redistribution 32b, is formed into, when viewed in plan, a shape that covers approximately a half of the semiconductor layer 112 (approximately a right half of the light receiving portion 112a illustrated in FIG. 3) and the circumference of which curves along the outer shapes of the external connection terminals 40b and 40d around peripheries of the external connection terminals 40b and 40d (FIG. 1C).

The reflecting portions 34a and 34b are preferably, when viewed in plan, arranged in such a way as to cover a region occupying 10% or more of the area of the semiconductor layer 112 capable of receiving light (that is, the light receiving portion 112a). That is, when viewed in plan, the sum of area of a region in which the reflecting portion 34a and the semiconductor layer 112 overlap each other and area of a region in which the reflecting portion 34b and the semiconductor layer 112 overlap each other is preferably 10% or more of the area of the semiconductor layer 112. In addition, when viewed in plan, the reflecting portions 34a and 34b are more preferably arranged in such a way as to cover a region occupying 20% or more of the area of the semiconductor layer 112, further more preferably arranged in such a way as to cover a region occupying 30% or more of the area, and still further more preferably arranged in such a way as to cover a region occupying 50% or more of the area.

Moreover, the reflecting portions 34a and 34b are preferably, when viewed in plan, arranged in such a way as to cover a region occupying 10% or more of a region in which the semiconductor layer and the electrodes do not overlap each other. That is, the sum of area of a region in which the reflecting portion 34a covers the semiconductor layer 112 and area of a region in which the reflecting portion 34b covers the semiconductor layer 112 is preferably 10% or more of the area of the semiconductor layer 112, more preferably 20% or more, further more preferably 30% or more, and still further more preferably 50% or more.

The first redistribution 32a in the optical device of the present embodiment includes a base layer 321a and a conductor layer 322a. The base layer 321a is formed by, for example, electroless plating or sputtering and subsequently acts as an electrode when the conductor layer 322a is formed by electroplating. The base layer 321a also plays a role of improving adhesiveness between the first insulating layer 311 and the conductor layer 322a. The base layer 321a is, for example, formed of copper (Cu) or formed by stacking titanium (Ti) and copper (Cu). The conductor layer 322a is formed on the base layer 321a and is formed by, for example, electroplating. The conductor layer 322a is, for example, formed of copper (Cu).

The second redistribution 32b in the optical device of the present embodiment includes a base layer 321b and a conductor layer 322b. The base layer 321b and the conductor layer 322b have similar configurations to those of the base layer 321a and the conductor layer 322a, respectively.

Second Insulating Layer

As illustrated in FIG. 2B, the second insulating layer 312 is an insulating layer that is formed on a portion of the surface of the first insulating layer 311 and the surfaces of the redistributions 32. The second insulating layer 312 is, as with the first insulating layer 311, formed of a resin material, such as polyimide. The second insulating layer 312 has openings 312a to 312d (the openings 312c and 312d are not illustrated) that penetrate the second insulating layer 312. This configuration enables, as illustrated in FIG. 2B, the pads 33a to 33d to be electrically coupled to the first redistribution 32a and the second redistribution 32b via the openings 312a and 312d.

The pads 33a to 33d are disposed for respectively coupling the external connection terminals 40a to 40d to the first redistribution 32a and the second redistribution 32b. The pads 33a to 33d are formed of, for example, stacked films of an Ni layer and an Au layer. The pads 33a to 33d cover respective surfaces of the first redistribution 32a and the second redistribution 32b that are exposed from the openings 312a to 312d of the second insulating layer 312 and the sidewalls of the openings 312a to 312d.

External Connection Terminal

The external connection terminals 40a to 40d are formed in contact with the pads 33a to 33d, respectively. The external connection terminals 40a and 40c are electrically coupled to portions of the first redistribution 32a that is exposed from the openings 312a and 312c of the second insulating layer 312, respectively, and the external connection terminals 40b and 40d are electrically coupled to portions of the second redistribution 32b that is exposed from the openings 312b and 312d of the second insulating layer 312, respectively. The external connection terminals 40a to 40d are, for example, solder balls. When the optical device 100 is mounted on a not-illustrated circuit board, the optical device 100 is arranged on the circuit board in such that the respective external connection terminals 40a to 40d come into contact with the circuit board at predetermined positions. Subsequently, by heating the external connection terminals 40a to 40d by reflow followed by cooling, the optical device 100 and the circuit board are soldered to each other. Note that an optical device of another embodiment does not have to include an external connection terminal.

In the optical device 100 of the present embodiment, the electrode 113a coupled to the first conductivity type semiconductor layer of the semiconductor layer 112 and the external connection terminals 40a and 40c are electrically coupled to each other by the first redistribution 32a. In addition, in the optical device 100, the electrode 113b coupled to the second conductivity type semiconductor layer of the semiconductor layer 112 and the external connection terminals 40b and 40d are electrically coupled to each other by the second redistribution 32b. That is, the external connection terminals 40a and 40c are external terminals coupled to the first conductivity type semiconductor layer, and the external connection terminals 40b and 40d are external terminals coupled to the second conductivity type semiconductor layer.

Method for Manufacturing Optical Device

Figure 6A:
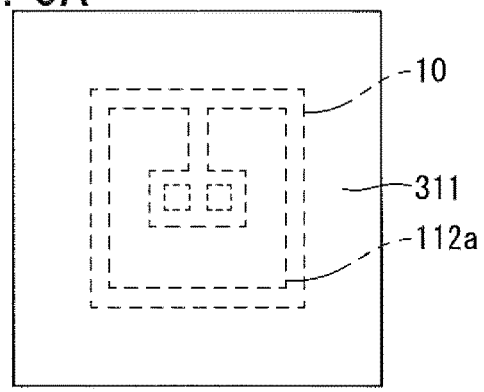
FIGS. 6A to 6G are manufacturing process diagrams illustrative of the other manufacturing processes of the optical device according to the first embodiment of the present invention viewed from the redistribution layer-formed surface side.

Hereinafter, a method for manufacturing the optical device 100 according to the present embodiment will be described using process cross-sectional views in FIGS. 4A to 4F and 5A to 5G and bottom views in FIGS. 6A to 6G. FIGS. 4A to 4F illustrate processes of forming a reconstituted substrate, using photoelectric conversion elements 10. In addition, FIGS. 5A to 5G and 6A to 6G illustrate processes of forming a redistribution layer 30 and external connection terminals 40 on a reconstituted substrate, and FIGS. 6A and 6B illustrate bottom views of the processes in FIGS. 5A and 5B, respectively.

Reconstituted Substrate Forming Processes

The reconstituted substrate forming processes will be described using FIGS. 4A to 4F.

Figure 4A:
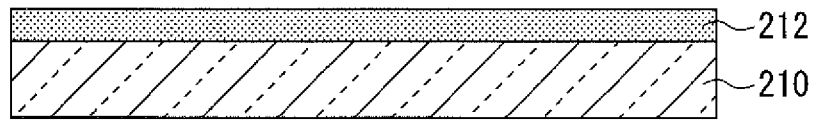
FIGS. 4A to 4F are process cross-sectional views illustrative of some manufacturing processes of the optical device according to the first embodiment of the present invention.

First, as illustrated in FIG. 4A, a substrate 210, such as a glass substrate, is prepared and an adhesive film 212 is adhered on one surface of the substrate 210.

Figure 4B:
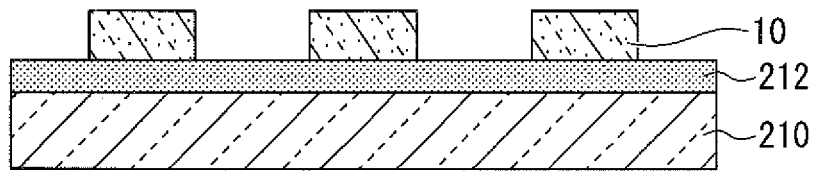

Succeedingly, as illustrated in FIG. 4B, the photoelectric conversion elements 10 in the form of individual pieces are adhered on the adhesive film 212 adhered on the one surface of the substrate 210. On this occasion, the photoelectric conversion elements 10 are adhered with the faces of the photoelectric conversion elements 10 on which semiconductor layers 112 and electrodes 113a and 113b are formed facing the adhesive film 212 side.

Figure 4C:
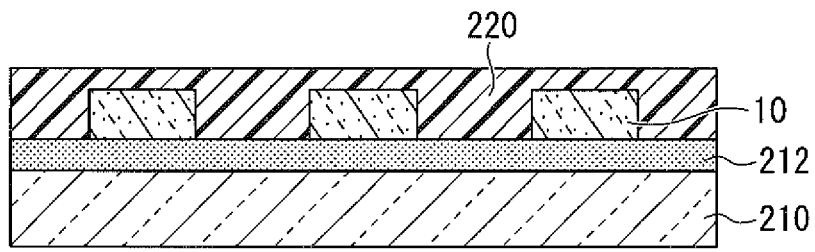

As illustrated in FIG. 4C, a molded resin layer 220 is formed by arranging the substrate 210, on the adhesive film 212 of which the photoelectric conversion elements 10 are adhered, in a cavity formed by a not-illustrated upper metal mold and lower metal mold, filling the cavity with melted resin, and curing the melted resin. The molded resin layer 220 is formed in such a way as to cover the photoelectric conversion elements 10. The molded resin layer 220 can be formed by, for example, compression molding or transfer molding.

Figure 4D:
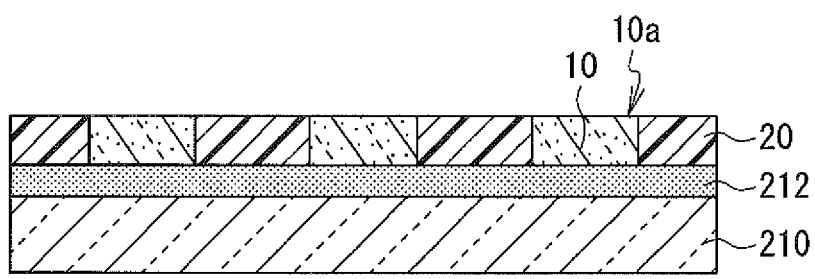

As illustrated in FIG. 4D, the upper surface of the molded resin layer 220 is polished by polishing or the like and the photoelectric conversion elements 10 are thereby exposed. This processing causes a sealing portion 20 covering the sidewalls of the photoelectric conversion elements 10 to be formed. This process may be performed after solder ball forming illustrated in FIG. 5G is performed.

Figure 4E:
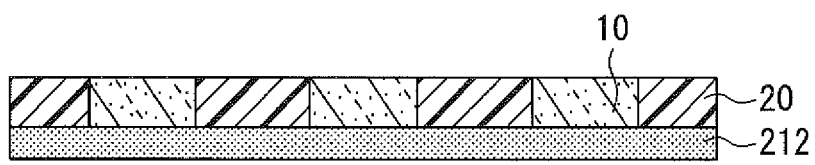
Figure 4F:
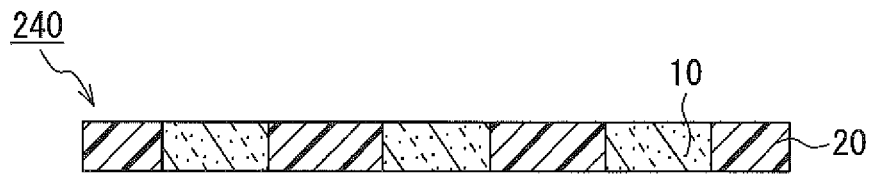

As illustrated in FIG. 4E, the substrate 210 is peeled off from the adhesive film 212, and subsequently, as illustrated in FIG. 4F, the adhesive film 212 is peeled off from the photoelectric conversion elements 10 and the sealing portion 20.

Consequently, a reconstituted substrate 240 is formed.

Redistribution Layer Forming Processes

Succeedingly, the processes of forming the redistribution layer 30 on the reverse surface of the reconstituted substrate 240 will be described using FIGS. 5A to 5G and 6A to 6G. Note that, in FIGS. 5A to 5G, in order to facilitate description, the redistribution layer forming processes will be described by enlarging a portion of the reconstituted substrate 240.

As illustrated in FIGS. 5A and 6A, a first insulating layer 311 is formed on the reverse surface of the reconstituted substrate 240 (an electrode-formed surface 10b of the photoelectric conversion element 10). Succeedingly, as illustrated in FIGS. 5B and 6B, openings 311a and 311b that penetrate the first insulating layer 311 are formed at positions of the electrodes 113a and 113b of the photoelectric conversion element 10 within the first insulating layer 311, respectively, and the electrodes 113a and 113b are thereby exposed.

Figure 6E:
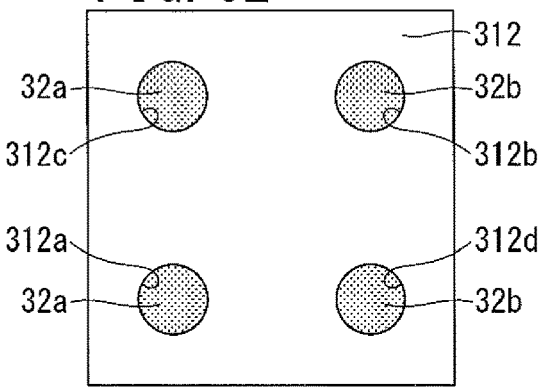
Figure 6B:
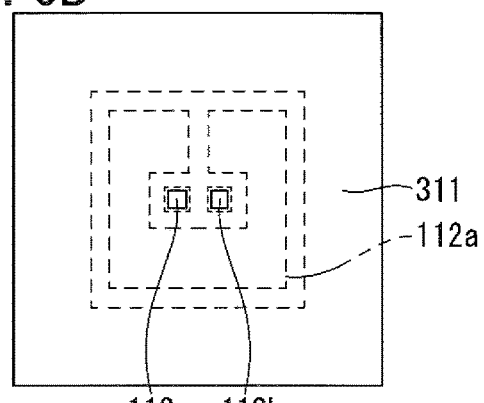
Figure 6F:
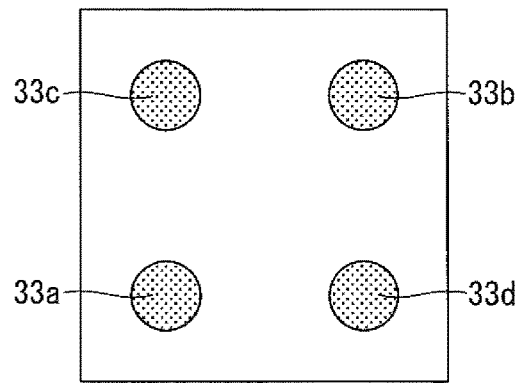
Figure 6C:
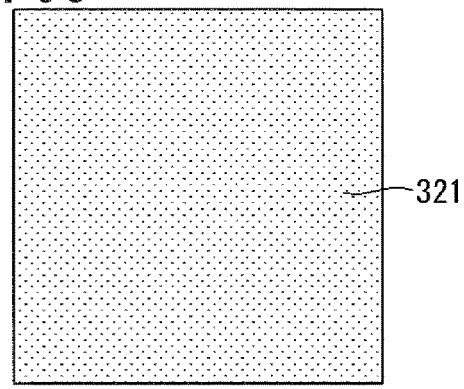

As illustrated in FIGS. 5C and 6C, a base layer 321 of a first redistribution 32a and a second redistribution 32b, which are integrated with reflecting portions 34a and 34b, respectively, is formed on the first insulating layer 311 by, for example, electroless copper (Cu) plating. The base layer 321 is formed in such a way as to cover a surface of the electrode 113a exposed from the opening 311a of the first insulating layer 311 and the sidewall of the opening 311a, a surface of the electrode 113b exposed from the opening 311b of the first insulating layer 311 and the sidewall of the opening 311b, and the entire surface of the first insulating layer 311.

Figure 6G:
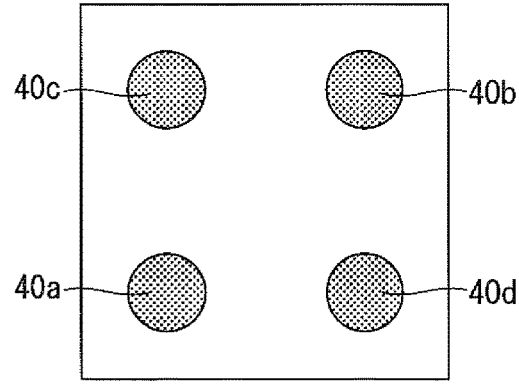
Figure 6D:
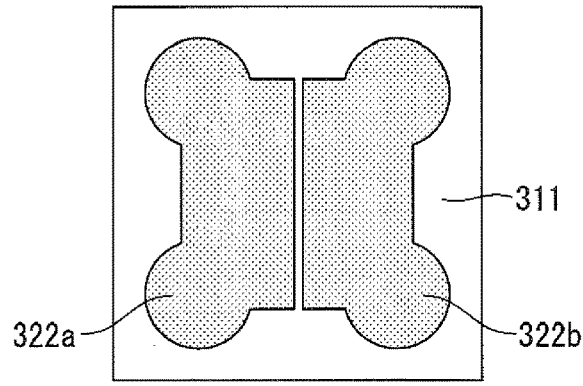

As illustrated in FIGS. 5D and 6D, by forming conductor layers 322a and 322b, the first redistribution 32a and the second redistribution 32b are formed. First, a resist pattern in which forming regions of the first redistribution 32a and the second redistribution 32b are opened is formed on the base layer 321, and the conductor layers 322a and 322b are formed by electroless copper (Cu) plating using the base layer 321 as an electrode. On this occasion, the conductor layers 322a and 322b are formed thicker than the base layer 321. Succeedingly, the resist is removed, and etching as deep as the thickness of the base layer 321 or more is performed on the entire surface at which the base layer 321 and the conductor layers 322a and 322b are formed. The etching removes a portion of the base layer 321 (a portion of the base layer 321 formed in a region other than the forming regions of the first redistribution 32a and the second redistribution 32b) and thereby forms the base layers 321a and 321b. Consequently, the first redistribution 32a, which is formed by the base layer 321a and the conductor layer 322a, and the second redistribution 32b, which is formed by the base layer 321b and the conductor layer 322b, are formed. The first redistribution 32a is formed in a region extending from the electrode 113a to positions at which a pad 33a and a pad 33c are to be formed, and the second redistribution 32b is formed in a region extending from the electrode 113b to positions at which a pad 33b and a pad 33d are to be formed.

As illustrated in FIGS. 5E and 6E, a second insulating layer 312 is formed on the first insulating layer 311, the first redistribution 32a, and the second redistribution 32b. Subsequently, openings 312a to 312d that penetrate the second insulating layer 312 are formed at portions at which the pads 33a to 33d are subsequently to be formed within the second insulating layer 312. The openings 312a and 312c are disposed on the first redistribution 32a. The openings 312b and 312d are disposed on the second redistribution 32b. This process exposes the first redistribution 32a from the openings 312a and 312c and the second redistribution 32b from the openings 312b and 312d.

As illustrated in FIGS. 5F and 6F, the pads 33a to 33d are formed at the positions of the openings 312a to 312d of the second insulating layer 312, respectively. The pads 33a to 33d are obtained by, for example, forming an Ni layer to serve as a base layer by electroless nickel (Ni) plating and subsequently forming an Au layer by electroless gold (Au) plating. The pads 33a to 33d are formed in such a way as to cover surfaces of the first redistribution 32a and the second redistribution 32b that are exposed from the openings 312a to 312d of the second insulating layer 312 and the sidewalls of the openings 312a to 312d.

As illustrated in FIGS. 5G and 6G, external connection terminals 40a to 40d (the external connection terminals 40c and 40d are not illustrated) are formed on the pads 33a to 33d, respectively, by solder balls. Last, by dicing the reconstituted substrate 240, on which the redistribution layer 30 is formed, at portions within the sealing portion 20, using a dicing blade, the optical devices 100 in the form of individual pieces can be obtained.

In addition to the above-described manufacturing method, a method of joining a wafer including a redistribution layer 30 and photoelectric conversion elements 10 may be used. Optical devices 100 in the form of individual pieces can be obtained by joining redistributions 32 of the wafer including the redistribution layer 30 and electrodes 113 of the photoelectric conversion elements 10 in such that the redistributions 30 are arranged in regions in which semiconductor layers 112 and the electrodes 113 of the photoelectric conversion elements 10 do not overlap each other and subsequently dicing the wafer. On this occasion, joining of the wafer and the elements may be performed in a manner in which portions of the electrodes 113 of the photoelectric conversion elements 10 are made of a material that melts by heat and the electrodes 113 and the redistributions 32 are electrically coupled to each other by reflow.

Variations of First Embodiment (1) Although, regarding the optical device 100 according to the first embodiment, an example in which the light incident surface 10a of the photoelectric conversion element 10 is disposed at the same height (in an identical plane) as the upper surface of the sealing portion 20 was described, the present invention is not limited to such a configuration.

For example, the light incident surface 10a (when an antireflection coating is disposed, the upper surface of the antireflection coating) of the photoelectric conversion element 10 may be disposed at a position recessed from the upper surface of the sealing portion 20 (the surface of the sealing portion 20 on the opposite side to the redistribution layer 30). In this case, the sealing portion 20 functions as a view angle restriction portion that restricts an incidence angle of light incident on the photoelectric conversion element 10. While the photoelectric conversion elements 10 are separated into individual pieces by dicing at the time of manufacturing, chipping sometimes occurs at the time of dicing and disturbance in incident light thus occurs in vicinities of portions of a photoelectric conversion element 10 in which chipping occurred. However, the sealing portion 20 functioning as a view angle restriction portion enables disturbance in light to be suppressed. In addition, the sealing portion 20 functioning as a view angle restriction portion enables the side surfaces of a film constituting the upper surface of the photoelectric conversion element 10 to be protected by the sealing portion 20 and water resistance to be thereby improved.

(2) In addition, the light incident surface 10a (when an antireflection coating is disposed, the upper surface of the antireflection coating) of the photoelectric conversion element 10 may be disposed at a position protruding from the upper surface of the sealing portion 20.

In this case, for example, when the molded resin layer 220 is formed, a resin sheet made of a fluororesin or the like is disposed on the surface of an upper metal mold and injection and curing of a melted resin are performed with the photoelectric conversion elements 10 digging into the resin sheet. This processing causes the reconstituted substrate 240 to be formed in such that the upper surfaces of the photoelectric conversion elements 10 protrude from the upper surface of the molded resin layer 220 (the sealing portion 20). The optical device 100 in which the light incident surface 10a of the photoelectric conversion element 10 protrudes from the sealing portion 20 is capable of receiving and emitting light, such as infrared rays, without the incidence angle or emission angle of the light being restricted by the sealing portion 20.

Advantageous Effects of First Embodiment

An optical device according to the first embodiment has the following advantageous effects.

(1) The optical device according to the first embodiment is capable of reflecting light that is incident on the optical device and transmitted to a redistribution layer to a semiconductor layer of a photoelectric conversion element, using a reflecting portion that is a portion of a redistribution. Because of this capability, the optical device according to the first embodiment is able to improve and/or make uniform light receiving efficiency. In addition, the optical device according to the first embodiment is capable of reflecting light that is emitted from the semiconductor layer to the redistribution layer side. Because of this capability, the optical device according to the first embodiment is able to improve and/or make uniform light emitting efficiency.

(2) In the optical device according to the first embodiment, wiring of the optical device can be configured in a redistribution layer. Because of this capability, it is possible to make the optical device thinner.

(3) In the optical device according to the first embodiment, a sealing portion formed of a resin material covers the side surfaces of the photoelectric conversion element that is a semiconductor element. This configuration causes one principal surface of the photoelectric conversion element to be exposed from the sealing portion and in contact with the redistribution layer and the other principal surface of the photoelectric conversion element to be exposed from the sealing portion and serve as a light incident surface. For this reason, in the optical device, even when the resin of the sealing portion swells, stress in the thickness direction of the semiconductor substrate is less likely to occur and the semiconductor substrate is less likely to warp. Since, for this reason, stress is not induced in the semiconductor layer, characteristic variation of the optical device is less likely to occur.

Specifically, variation in light-receiving sensitivity of an infrared sensor and variation in a resistance value of the semiconductor layer are less likely to occur. Particularly, when the optical device is a gas sensor, which is required to have a resolution in the order of ppb, even a minute change in an optical signal level due to influence of disturbance causes a substantial error to occur in a measurement result of gas concentration. Thus, the optical device according to the present embodiment enables variation in measurement results of gas concentration to be notably less likely to occur.

(4) When an antireflection coating is provided on the upper surface of a photoelectric conversion element of an optical device, the optical device is capable of suppressing light incident on the photoelectric conversion element from the outside of the photoelectric conversion element from being reflected by the surface of the photoelectric conversion element by means of the antireflection coating and thereby improving light incidence efficiency.

2. Second Embodiment

Hereinafter, a second embodiment of the present invention will be described with reference to the drawings.

Configuration of Optical Device

Figure 7A:
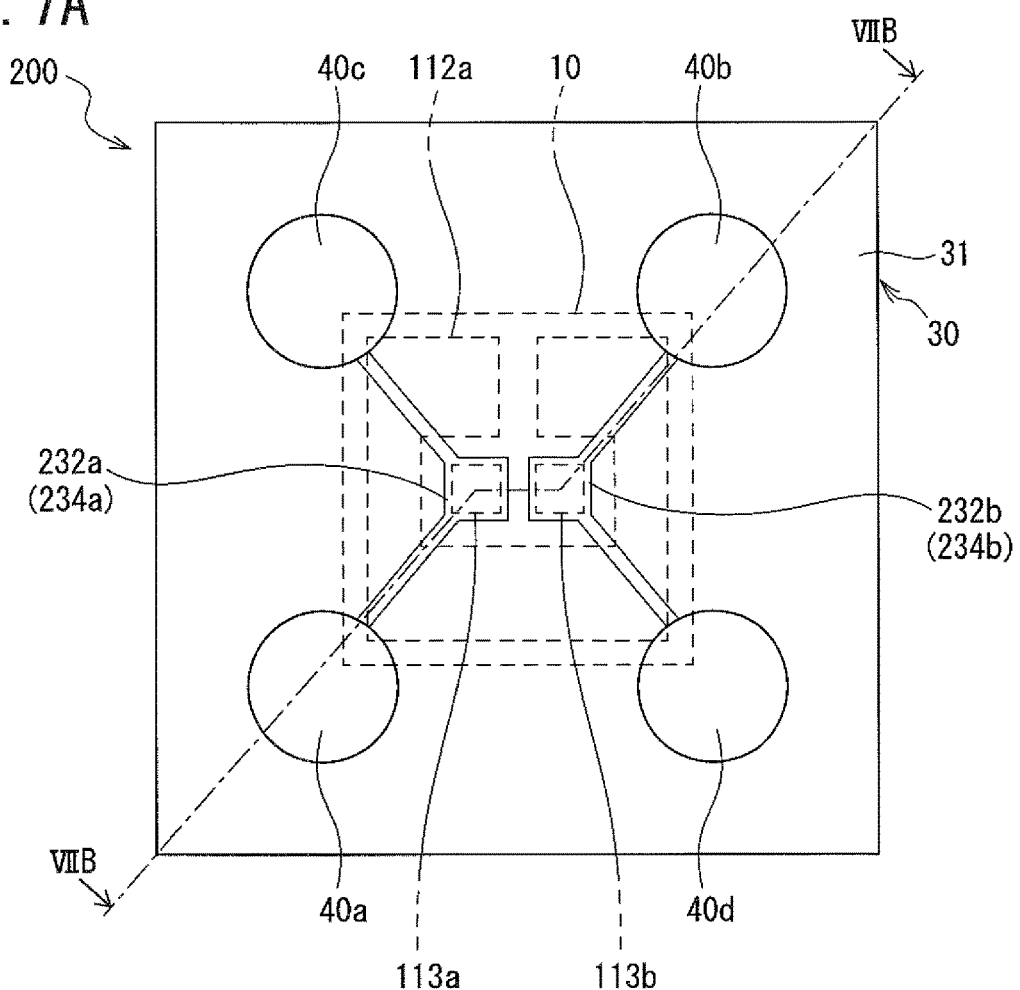
FIGS. 7A and 7B are schematic views illustrative of a configuration example of an optical device according to a second embodiment of the present invention.
Figure 7B:
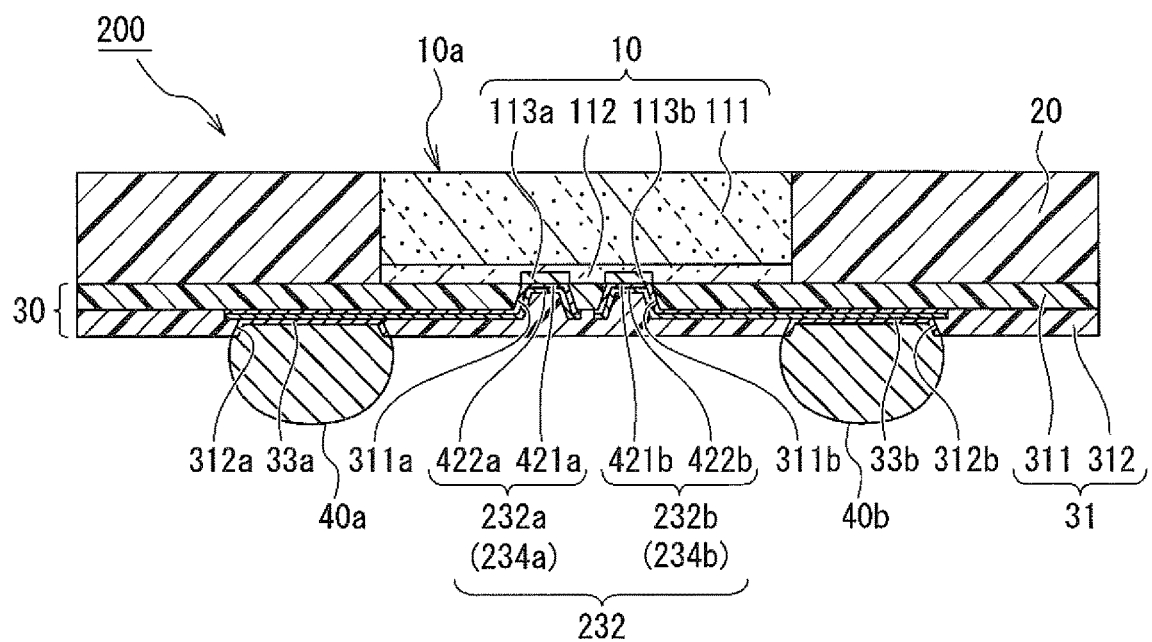

Using FIGS. 7A and 7B with reference to FIG. 3, a configuration of an optical device 200 according to the second embodiment will be described. FIGS. 7A and 7B are a bottom view of the optical device 200 and a cross-sectional view illustrative of a configuration in a cross-section taken along the line VIIB-VIIB of FIG. 7A, respectively. FIG. 7B is a cross-sectional view illustrated in such a manner that the bottom surface of the optical device 200 faces downward.

As illustrated in FIGS. 7A and 7B, the optical device 200 differs from the optical device 100 of the first embodiment in that the optical device 200 includes, in place of the redistributions 32 of the first embodiment, redistributions 232 having shapes different from those of the redistributions 32. The redistributions 232 include a first redistribution 232a and a second redistribution 232b.

Since the other constituent elements are the same as those in the above-described first embodiment, descriptions thereof will be omitted.

Redistribution and Reflecting Portion

As illustrated in FIG. 7A, the redistributions 232 of the optical device 200 are disposed in a region that, when viewed in plan, faces a semiconductor layer 112 (a light receiving portion 112a). As illustrated in FIG. 7B, the first redistribution 232a has a shape of fine lines extending from an electrode 113a to pads 33a and 33c (the pad 33c is not illustrated), and the second redistribution 232b has a shape of fine lines extending from an electrode 113b to pads 33b and 33d (the pad 33d is not illustrated).

The first redistribution 232a and the second redistribution 232b, which have fine line shapes, also function as reflecting portions 234a and 234b. The reflecting portions 234a and 234b are preferably, when viewed in plan, arranged in such a way as to cover a region occupying 10% or more of the area of the semiconductor layer 112 capable of receiving light (that is, the light receiving portion 112a). That is, the sum of area of a region in which the reflecting portion 234a covers the light receiving portion 112a and area of a region in which the reflecting portion 234b covers the light receiving portion 112a is preferably 10% or more of the area of the light receiving portion 112a. In addition, when viewed in plan, the reflecting portions 234a and 234b are more preferably arranged in such a way as to cover a region occupying 20% or more of the area of the light receiving portion 112a and further more preferably arranged in such a way as to cover a region occupying 30% or more of the area.

As illustrated in FIG. 7B, the first redistribution 232a, which functions as the reflecting portion 234a, includes a base layer 421a and a conductor layer 422a. The second redistribution 232b, which functions as the reflecting portion 234b, includes a base layer 421b and a conductor layer 422b. The base layers 421a and 421b are formed using a similar material and a similar method to those of the base layers 321a and 321b of the optical device 100 in the first embodiment. In addition, the conductor layers 422a and 422b are formed using a similar material and a similar method to those of the conductor layers 322a and 322b of the optical device 100 in the first embodiment.

Advantageous Effects of Second Embodiment

An optical device according to the second embodiment has the following advantageous effect in addition to the advantageous effects (2) to (4) in the first embodiment.

(5) In the optical device according to the second embodiment, redistributions that function as reflecting portions have fine line shapes. While, when the reflecting portions are formed wide, it is required to perform roughening plating on the surface of the reflecting portion in order to improve adhesiveness with a second insulating layer formed on the reflecting portions, when the redistributions have fine line shapes, the reflecting portions and the second insulating layer have sufficient adhesiveness therebetween and it is thus not required to perform roughening plating. Because of the characteristics, it is not required to increase forming processes of the optical device.

3. Third Embodiment

Hereinafter, a third embodiment of the present invention will be described with reference to the drawings.

Configuration of Optical Device

Figure 8A:
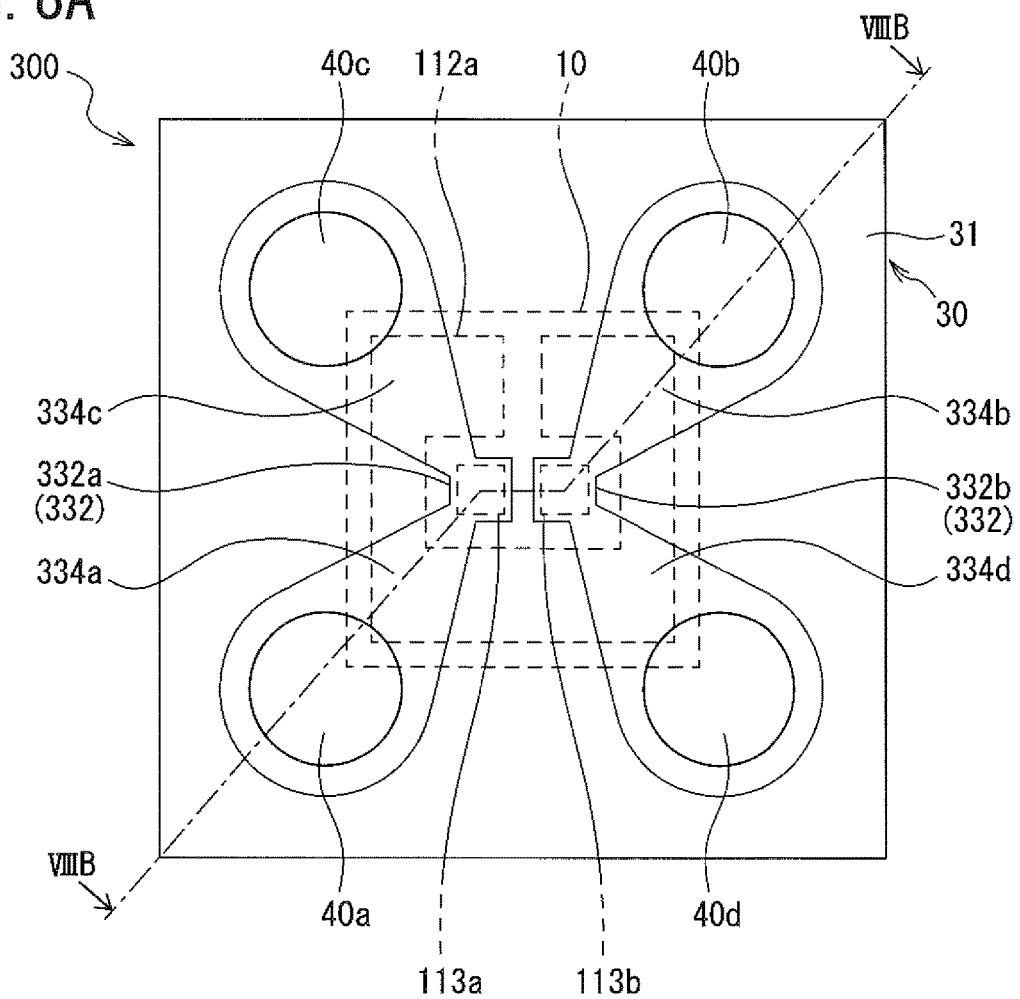
FIGS. 8A and 8B are schematic views illustrative of a configuration example of an optical device according to a third embodiment of the present invention.
Figure 8B:
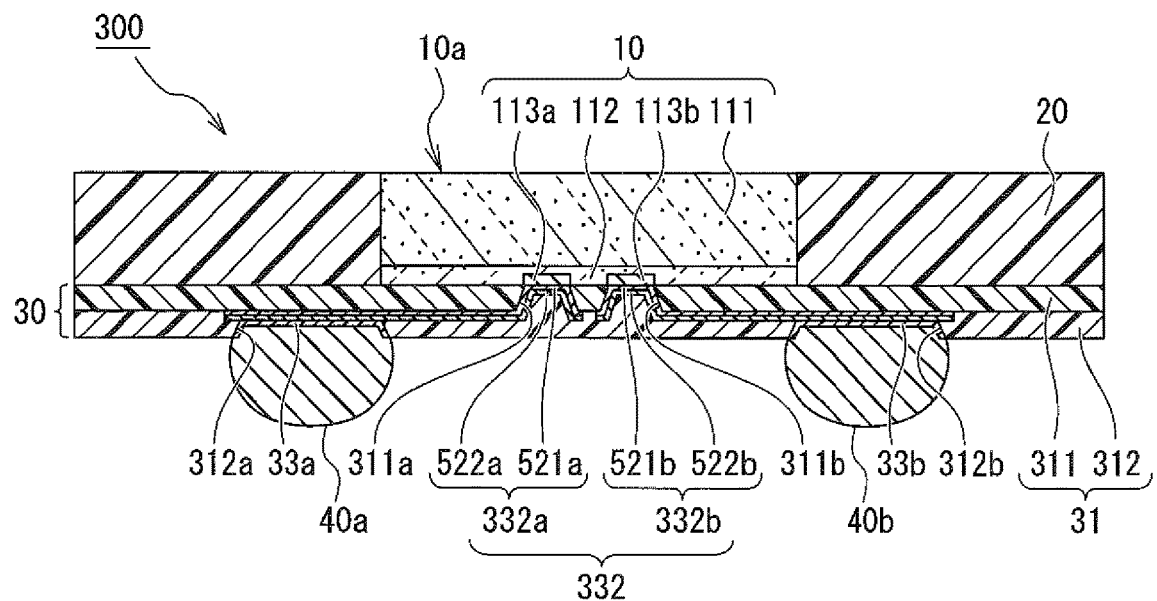

Using FIGS. 8A and 8B with reference to FIG. 3, a configuration of an optical device 300 according to the third embodiment will be described. FIGS. 8A and 8B are a bottom view of the optical device 300 and a cross-sectional view illustrative of a configuration in a cross-section taken along the line VIIIB-VIIIB of FIG. 8A, respectively. FIG. 8B is a cross-sectional view illustrated in such a manner that the bottom surface of the optical device 300 faces downward.

As illustrated in FIGS. 8A and 8B, the optical device 300 differs from the optical device 100 of the first embodiment in that the optical device 300 includes, in place of the redistributions 32 of the first embodiment, redistributions 332 having shapes different from those of the redistributions 32. The redistributions 332 include a first redistribution 332a and a second redistribution 332b.

Since the other constituent elements are the same as those in the above-described first embodiment, descriptions thereof will be omitted.

Redistribution and Reflecting Portion

The redistributions 332 of the optical device 300 are disposed in a region that, when viewed in plan, faces a semiconductor layer 112 (a light receiving portion 112a). As illustrated in FIG. 8B, the first redistribution 332a extends from an electrode 113a to pads 33a and 33c (the pad 33c is not illustrated), and the second redistribution 332b extends from an electrode 113b to pads 33b and 33d (the pad 33d is not illustrated).

As illustrated in FIG. 8A, reflecting portions 334a to 334d are disposed in regions in which the the semiconductor layer 112 (the light receiving portion 112a) and electrodes 113a and 113b do not overlap each other. The reflecting portions 334a and 334c have shapes the widths of which widen from the electrode 113a toward external connection terminals 40a and 40c, respectively. In addition, the reflecting portions 334b and 334d have shapes the widths of which widen from the electrode 113b toward external connection terminals 40b and 40d, respectively.

In a photoelectric conversion element 10 of the present embodiment, the reflecting portions 334a and 334c are formed in such a way as to be a portion of the first redistribution 332a, that is, the reflecting portions 334a and 334c are formed integrally with the first redistribution 332a. Similarly, the reflecting portions 334b and 334d are formed in such a way as to be a portion of the second redistribution 332b, that is, the reflecting portions 334b and 334d are formed integrally with the second redistribution 332b. For this reason, each of the reflecting portions 334a to 334d also functions as the first redistribution 332a or the second redistribution 332b, and the first redistribution 332a or the second redistribution 332b also functions as any of the reflecting portions 334a to 334d.

As illustrated in FIG. 8B, the first redistribution 332a, with which the reflecting portions 334a and 334c are integrated, includes a base layer 521a and a conductor layer 522a. The second redistribution 332b, with which the reflecting portions 334b and 334d are integrated, includes a base layer 521b and a conductor layer 522b. The base layers 521a and 521b are formed using a similar material and a similar method to those of the base layers 321a and 321b of the optical device 100 in the first embodiment. In addition, the conductor layers 522a and 522b are formed using a similar material and a similar method to those of the conductor layers 322a and 322b of the optical device 100 in the first embodiment.

Advantageous Effects of Third Embodiment

An optical device according to the third embodiment has the following advantageous effect in addition to the advantageous effects (1) to (4) in the first embodiment.

(6) In the optical device according to the third embodiment, redistributions that function as reflecting portions have shapes the widths of which widen from electrodes toward external connection terminals. Because of this configuration, it is possible to, by forming the reflecting portions narrow in vicinities of the electrodes, facilitate the formation of the reflecting portions, and it is also possible to, by forming the reflecting portions wide in vicinities of the external connection terminals, increase area of the reflecting portions and thereby improve light receiving efficiency for incident light.

4. Fourth Embodiment

Hereinafter, a fourth embodiment of the present invention will be described with reference to the drawings.

Configuration of Optical Device

Figure 9:
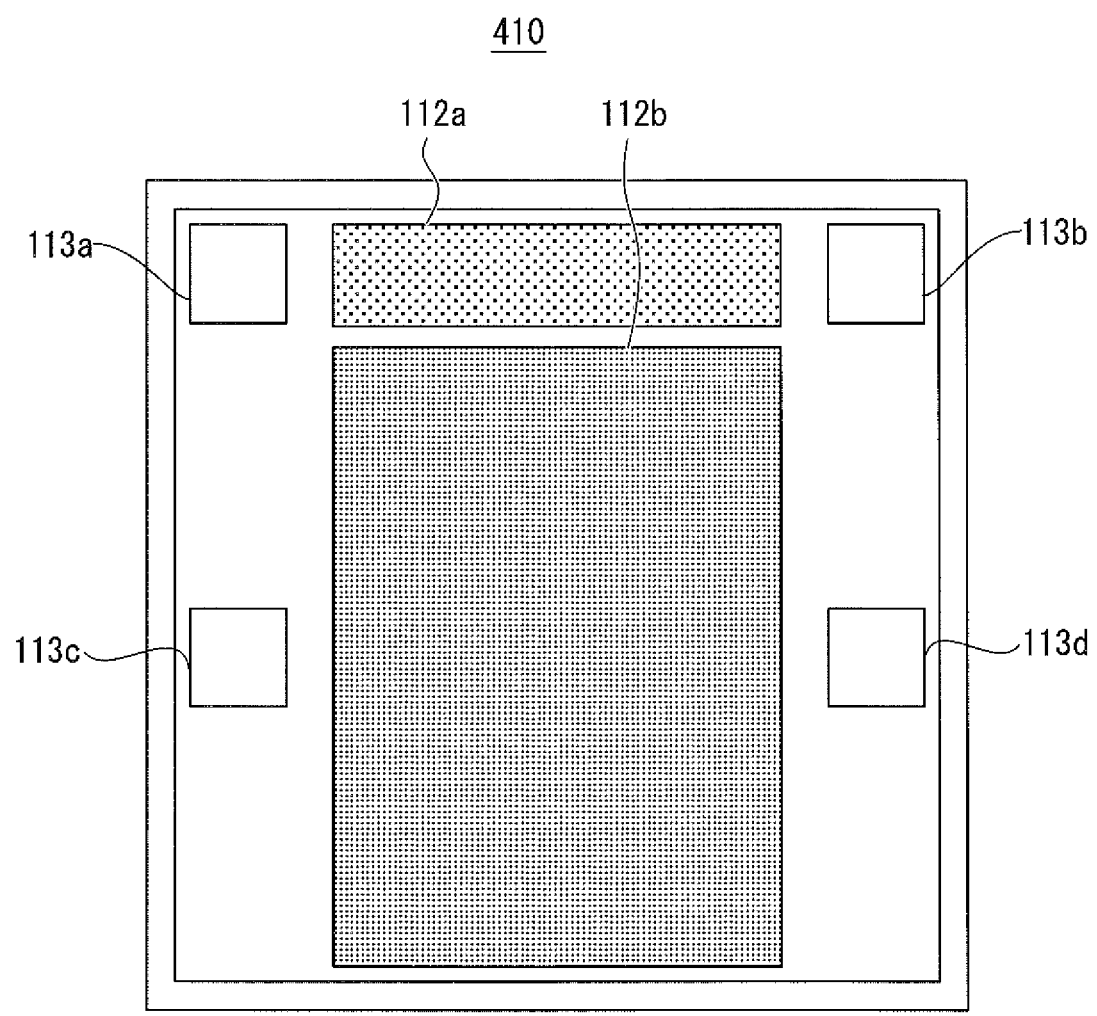
FIG. 9 is a schematic diagram illustrative of a configuration of a light receiving portion, a light emitting portion, and electrodes of a photoelectric conversion element that is used in an optical device according to a fourth embodiment of the present invention.
Figure 10A:
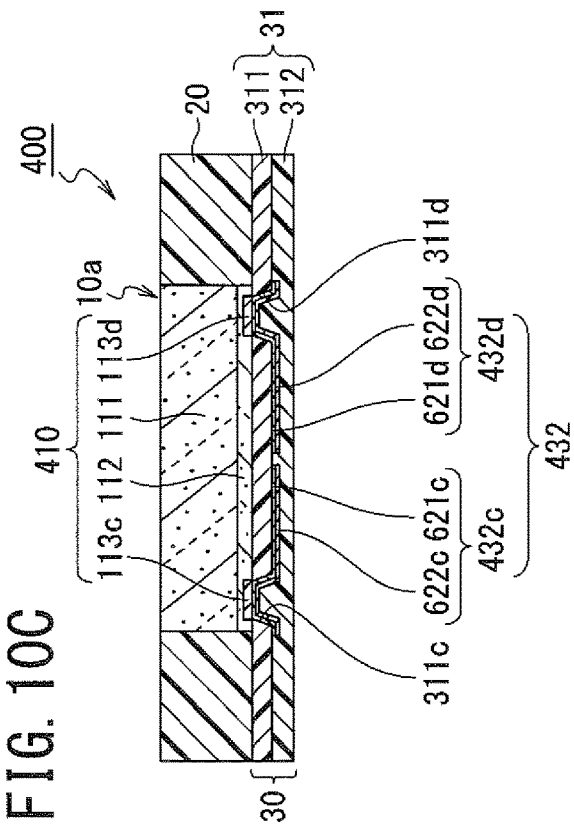
FIGS. 10A to 10D are schematic views illustrative of a configuration example of the optical device according to the fourth embodiment of the present invention.
Figure 10C:
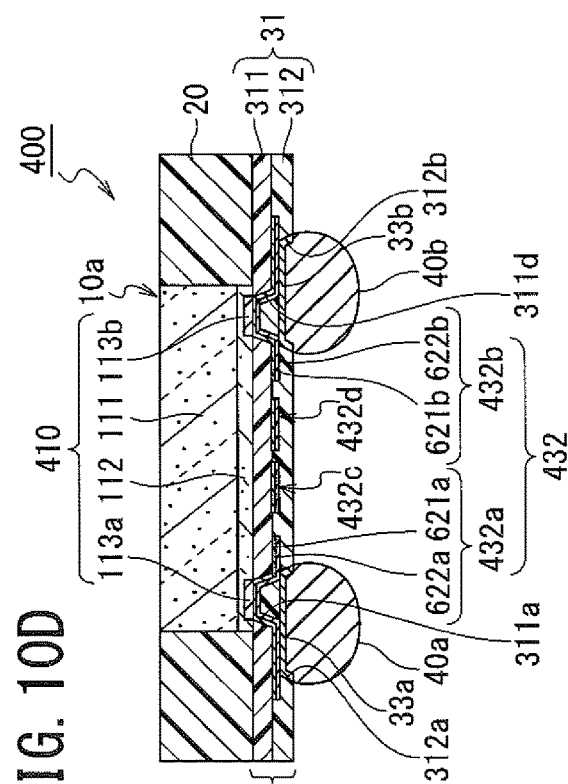
Figure 10B:
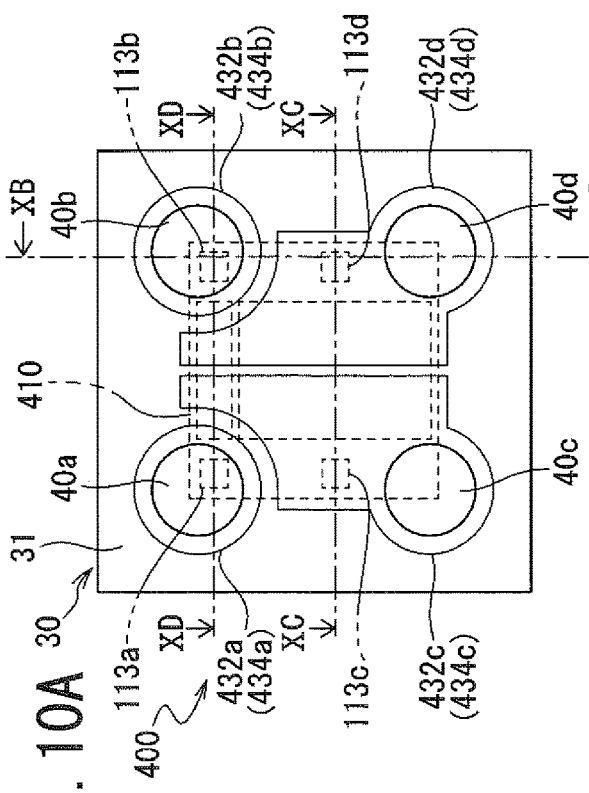
Figure 10D:
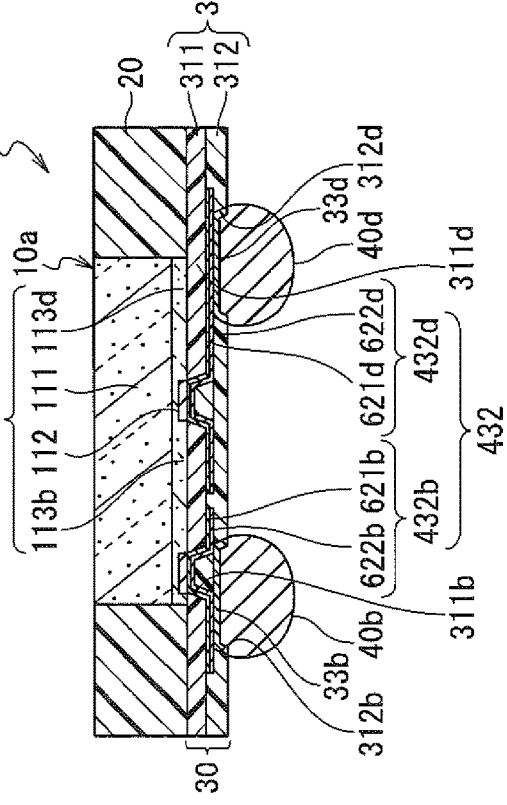

Using FIGS. 9 and 10A to 10D, a configuration of an optical device 400 according to the fourth embodiment will be described. FIG. 9 is a schematic diagram illustrating a configuration of a photoelectric conversion element 410 that is used in the optical device 400 according to the fourth embodiment. FIGS. 10A, 10B, 10C, and 10D are a bottom view of the optical device 400, a cross-sectional view illustrative of a configuration in a cross-section taken along the line XB-XB of FIG. 10A, a cross-sectional view illustrative of a configuration in a cross-section taken along the line XC-XC of FIG. 10A, and a cross-sectional view illustrative of a configuration in a cross-section taken along the line XD-XD of FIG. 10A, respectively. FIGS. 10B to 10D are cross-sectional views illustrated in such a manner that the bottom surface of the optical device 400 faces downward.

As illustrated in FIG. 9, the optical device 400 differs from the optical device 100 of the first embodiment in that the optical device 400 includes, in place of the photoelectric conversion element 10 of the first embodiment, the photoelectric conversion element 410 that has both a light receiving portion and a light emitting portion. In addition, as illustrated in FIGS. 10A and 10B, the optical device 400 differs from the optical device 100 of the first embodiment in that the optical device 400 includes, in place of the redistributions 32 of the first embodiment, redistributions 432 having shapes different from those of the redistributions 32. The redistributions 432 include a first redistribution 432a to a fourth redistribution 432d.

Since the other constituent elements are the same as those in the above-described first embodiment, descriptions thereof will be omitted.

Photoelectric Conversion Element

The photoelectric conversion element 410 according to the fourth embodiment includes a semiconductor substrate 111, a semiconductor layer 112 formed on one principal surface (the lower surface illustrated in FIGS. 10B to 10D) of the semiconductor substrate 111, and electrodes 113 (113a to 113d) formed on the semiconductor layer 112. As illustrated in FIG. 9, the semiconductor layer 112 includes a light receiving portion 112a capable of receiving light and a light emitting portion 112b capable of emitting light. The photoelectric conversion element 410 receives light from the light emitting portion 112b by means of the light receiving portion 112a by way of the semiconductor substrate 111 and thereby monitors the amount of light emission.

The photoelectric conversion element 410 has, as the electrodes 113, the electrodes 113a to 113d, which are formed on the semiconductor layer 112. The electrode 113a is electrically coupled to a first conductivity type semiconductor layer of the semiconductor layer 112 that constitutes the light receiving portion 112a. The electrode 113b is electrically coupled to a second conductivity type semiconductor layer of the semiconductor layer 112 that constitutes the light receiving portion 112a. The electrode 113c is electrically coupled to a first conductivity type semiconductor layer of the semiconductor layer 112 that constitutes the light emitting portion 112b. The electrode 113d is electrically coupled to a second conductivity type semiconductor layer of the semiconductor layer 112 that constitutes the light emitting portion 112b.

Note that the photoelectric conversion element 410 may have, in addition to the above-described electrodes, for example, an electrode for test.

Redistribution Layer

Redistribution and Reflecting Portion

As illustrated in FIG. 10A, the first redistribution 432a and second redistribution 432b of the optical device 400 are formed into, when viewed in plan, shapes that cover the electrodes 113a and 113b and the circumferences of which curve along the outer shapes of external connection terminals 40a and 40b, respectively. The first redistribution 432a and the second redistribution 432b extend from the electrodes 113a and 113b to pads 33a and 33b, respectively. The third redistribution 432c and fourth redistribution 432d of the optical device 400, when viewed in plan, cover the electrodes 113c and 113d and extend from the electrodes 113c and 113d to pads 33c and 33d (the pad 33c is not illustrated) via openings 311c and 311d, respectively.

A reflecting portion 434c is formed in such a way as to be a portion of the third redistribution 432c, that is, the reflecting portion 434c is formed integrally with the third redistribution 432c. Similarly, a reflecting portion 434d is formed in such a way as to be a portion of the fourth redistribution 432d, that is, the reflecting portion 434d is formed integrally with the fourth redistribution 432d. For this reason, each of the reflecting portions 434c and 434d also functions as the third redistribution 432c or the fourth redistribution 432d, and each of the third redistribution 432c and the fourth redistribution 432d also functions as either of the reflecting portions 434c and 434d.

The third redistribution 432c, with which the reflecting portion 434c is integrated, and the fourth redistribution 432d, with which the reflecting portion 434d is integrated, are disposed, when viewed in plan, in a region in which the light receiving portion 112a and the light emitting portion 112b do not overlap the electrodes 113a and 113b. The third redistribution 432c, with which the reflecting portion 434c is integrated, is formed into a shape that covers most of the left halves (the left side in FIG. 10A) of the light receiving portion 112a and the light emitting portion 112b and does not interfere with the first redistribution 432a. In addition, the fourth redistribution 432d, with which the reflecting portion 434d is integrated, is formed into a shape that covers most of the right halves (the right side in FIG. 10A) of the light receiving portion 112a and the light emitting portion 112b and does not interfere with the second redistribution 432b.

As illustrated in FIGS. 10B and 10C, the first redistribution 432a and the second redistribution 432b include base layers 621a and 621b and conductor layers 622a and 622b, respectively. In addition, the third redistribution 432c, with which the reflecting portion 434c is integrated, and the fourth redistribution 432d, with which the reflecting portion 434d is integrated, include base layers 621c and 621d and conductor layers 622c and 622d, respectively. The base layers 621a to 621d are formed using a similar material and a similar method to those of the base layers 321a and 321b of the optical device 100 in the first embodiment. In addition, the conductor layers 622a to 622d are formed using a similar material and a similar method to those of the conductor layers 322a and 322b of the optical device 100 in the first embodiment.

Advantageous Effects of Fourth Embodiment

An optical device according to the fourth embodiment has the following advantageous effect in addition to the advantageous effects (1) to (4) in the first embodiment.

(7) The optical device according to the fourth embodiment is capable of reflecting light that is emitted from a photoelectric conversion element and transmitted to a redistribution layer to the outside of the optical device, using a reflecting portion that is integrated with a redistribution. Because of this capability, the optical device according to the fourth embodiment is able to improve light emitting efficiency.

5. Fifth Embodiment

Hereinafter, a fifth embodiment of the present invention will be described with reference to the drawings.

Configuration of Optical Device

Using FIGS. 11A to 11D with reference to FIG. 9, a configuration of an optical device 500 according to the fifth embodiment will be described. FIGS. 11A, 11B, 11C, and 11D are a bottom view of the optical device 500, a cross-sectional view illustrative of a configuration in a cross-section taken along the line XIB-XIB of FIG. 11A, a cross-sectional view illustrative of a configuration in a cross-section taken along the line XIC-XIC of FIG. 11A, and a cross-sectional view illustrative of a configuration in a cross-section taken along the line XID-XID of FIG. 11A, respectively. FIGS. 11B to 11D are cross-sectional views illustrated in such a manner that the bottom surface of the optical device 500 faces downward.

As illustrated in FIG. 11A to FIG. 11D, the optical device 500 differs from the optical device 100 of the first embodiment in that the optical device 500 includes, in place of the redistributions 432 of the fourth embodiment, redistributions 532 and a reflecting portion 534. The redistributions 532 include a first redistribution 532a to a fourth redistribution 532d. The first redistribution 532a and the second redistribution 532b have similar shapes and configurations to those of the first redistribution 432a and the second redistribution 432b, respectively.

On the other hand, the optical device 500 differs from the optical device 400 of the fourth embodiment in that the third redistribution 532c and the fourth redistribution 532d have shapes different from those of the third redistribution 432c and the fourth redistribution 432d, respectively, and are not integrated with the reflecting portion 534. The optical device 500 also differs from the optical device 400 of the fourth embodiment in including a terminal 40e that is electrically coupled to the reflecting portion 534.

Since the other constituent elements are the same as those in the above-described first embodiment, descriptions thereof will be omitted. That is, a photoelectric conversion element 410 that the optical device 500 includes has a similar configuration to that of the photoelectric conversion element 410 used in the fourth embodiment. In addition, since, as described above, the first redistribution 532a and the second redistribution 532b that the optical device 500 includes have similar configurations to those of the first redistribution 432a and the second redistribution 432b of the fourth embodiment, respectively, descriptions thereof will be omitted.

Redistribution Layer

Redistribution

As illustrated in FIG. 11A, the third redistribution 532c, when viewed in plan, is formed into a shape that covers an electrode 113c, the circumference of which curves along the outer shape of the external connection terminal 40c around a periphery of the external connection terminal 40c, and that extends from the electrode 113c to a pad 33c. The fourth redistribution 532d, when viewed in plan, is formed into a shape that covers an electrode 113d, the circumference of which curves along the outer shape of the external connection terminal 40d around a periphery of the external connection terminal 40d, and that extends from the electrode 113d to a pad 33d. That is, the third redistribution 532c and the fourth redistribution 532d electrically couple the electrodes 113c and 113d to the external connection terminals 40c and 40d, respectively.

Reflecting Portion

The reflecting portion 534 is formed without being electrically coupled to the electrodes 113a to 113d. The reflecting portion 534 is disposed at the same layer as that of at least portions of the redistributions 532 as a separate entity from the redistributions 532, that is, separately from the redistributions 532. As used herein, the expression "disposed at the same layer" means, for example, being disposed on the surface of the same insulating layer. The reflecting portion 534 is formed on the surface of a first insulating layer 311 on which portions of the redistributions 532 (the first redistribution 532a to the fourth redistribution 532d) is formed, that is, formed at the same layer as that of at least portions of the first redistribution 532a to the fourth redistribution 532d. In addition, the expression "disposed as a separate entity" means being disposed in a state of being physically separated.

As illustrated in FIG. 11C, to the reflecting portion 534, the terminal 40e is coupled via a pad 33e. The terminal 40e is disposed to prevent the reflecting portion 534 from being charged with electric charges by current flowing through the redistributions 532 (the first redistribution 532a to the fourth redistribution 532d) and is coupled to a conductor layer on a circuit board (not illustrated). The terminal 40e is formed in a similar manner to the external connection terminals 40a to 40d. In addition, the pad 33e is formed in a similar manner to pads 33a to 33d.

As illustrated in FIGS. 11B to 11D, the first redistribution 532a to the fourth redistribution 532d and the reflecting portion 534 include base layers 721a to 721e and conductor layers 722a to 722e, respectively. The base layers 721a to 721e are formed using a similar material and a similar method to those of the base layers 321a and 321b of the optical device 100 in the first embodiment. In addition, the conductor layers 722a to 722e are formed using a similar material and a similar method to those of the conductor layers 322a and 322b of the optical device 100 in the first embodiment.

Advantageous Effects of Fifth Embodiment

An optical device according to the fifth embodiment has the following advantageous effect in addition to the advantageous effects (1) to (4) in the first embodiment.

(8) The optical device according to the fifth embodiment is capable of reflecting light that is emitted from a photoelectric conversion element and transmitted to a redistribution layer to the outside of the optical device, using a reflecting portion that is disposed separately from redistributions. Because of this capability, it is possible to increase the number of external terminals and thereby improve mounting strength.

Variation of Fifth Embodiment

The reflecting portion 534 may be applied to, for example, the optical device 200 of the second embodiment or the optical device 300 of the third embodiment, which includes redistributions with which reflecting portions are formed integrally.

6. Sixth Embodiment

Hereinafter, a sixth embodiment of the present invention will be described with reference to the drawings.

The sixth embodiment and a variation of the sixth embodiment are optical devices each of which includes an optical member block (a collective term of a filter block and a lens block) that includes an optical member (a collective term of an optical filter and an optical lens) and a sealing member covering a side surface of the optical member, in which a recessed portion is formed by one surface of a filter chip of the optical member and the sealing member, at least a portion of the bottom surface of the recessed portion is formed by the one surface of the filter chip of the optical member, and a sidewall of the recessed portion is formed by the sealing member, in which the optical member block is arranged in such that the recessed portion covers an exposed surface of the photoelectric conversion element on the opposite side to an electrode-formed surface of the photoelectric conversion element on which the electrodes are formed.

Configuration of Optical Device

Using FIGS. 12A to 12D with reference to FIGS. 1A to 4F, a configuration of an optical device according to the sixth embodiment will be described. FIGS. 12A to 12D are configuration diagrams for a description of an optical device 600 according to the sixth embodiment, and FIGS. 12A, 12B, 12C, and 12D are a plan view illustrative of a configuration example of the optical device 600, a side view of the optical device 600, a cross-sectional view schematically illustrative of a cross-section taken along the line XIIC-XIIC of FIG. 12A, and a bottom view illustrative of the configuration example of the optical device 600, respectively.

The optical device according to the sixth embodiment is an optical device 600 with filter block that includes an optical filter block (hereinafter, referred to as a filter block) 610 on the light incident surface 10a side of the optical device 100 according to the first embodiment. The filter block 610 is a form of an optical member block. The filter block 610 includes an optical filter chip (hereinafter, referred to as an optical filter) 612. Note that the filter block 610 according to the sixth embodiment may be applied to the optical device 200 according to the second embodiment to the optical device 500 according to the fifth embodiment.

In the optical device 600, light is incident on a photoelectric conversion element 10 of the optical device 100 through the optical filter 612 in the filter block 610 and is detected. That is, the optical device 600 differs from the optical device 100 according to the first embodiment in including the filter block 610.

Since the constituent elements other than the filter block 610 are the same as those in the above-described first embodiment, descriptions thereof will be omitted.

Filter Block

The filter block 610 includes the optical filter 612 and a sealing member 620 configured to cover the side surfaces of the optical filter 612. This configuration causes one surface 612a of the optical filter 612 serving as a light incident surface and the other surface 612b thereof serving as a light emitting surface are exposed from the sealing member 620. Hereinafter, the one surface 612a and the other surface 612b of the optical filter 612 are referred to as a light incident surface 612a and a light emitting surface 612b, respectively.

In the filter block 610, a recessed portion 630 is formed by the light emitting surface 612b of the optical filter 612 and the sealing member 620. At least a portion of a bottom surface 630a of the recessed portion 630 is formed by the light emitting surface 612b of the optical filter 612, and sidewalls 630b of the recessed portion 630 are formed by the sealing member 620. The optical filter 612 is arranged in such that the recessed portion 630 covers the photoelectric conversion element 10, which exposes a surface thereof from a sealing portion 20 of the optical device 100. The filter block 610 and the optical device 100 are connected to each other by means of a connecting member 650 that is made of an adhesive material or the like.

Figure 12A:
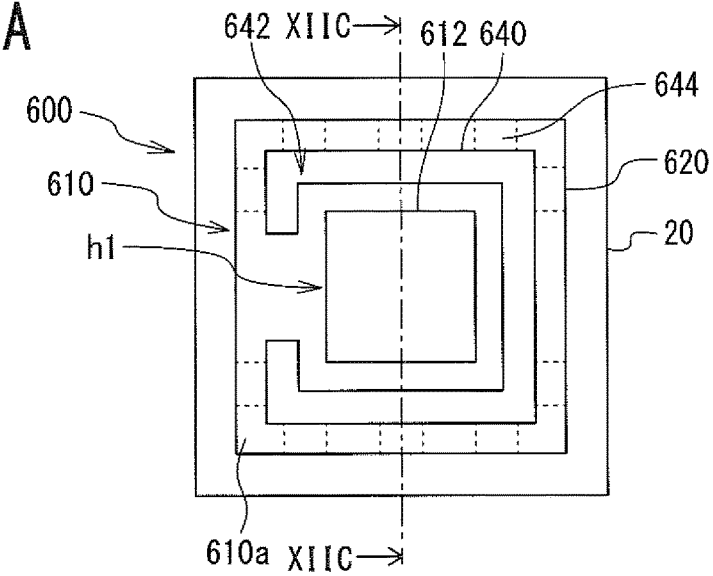
FIGS. 12A to 12D are schematic views illustrative of a configuration example of an optical device with filter block according to a sixth embodiment of the present invention.
Figure 12B:
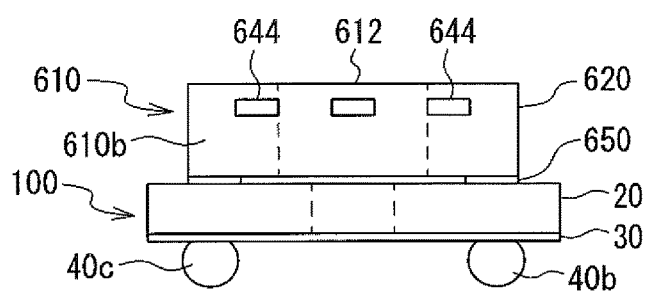
Figure 12C:
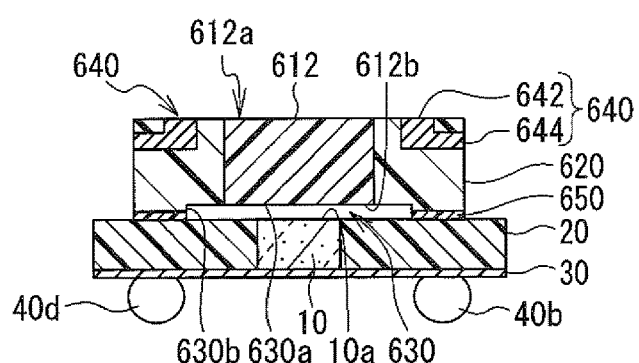
Figure 12D:
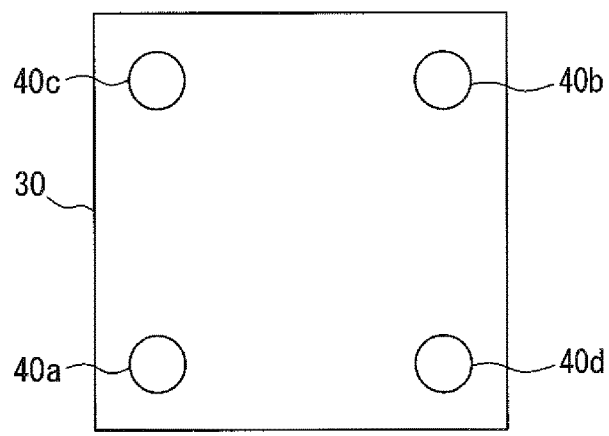

The filter block 610 also includes a frame member 640 that has an opening h1 for arranging the optical filter 612. The frame member 640 includes an annular portion 642 that surrounds the optical filter 612 and a plurality of connecting portions 644 each of which extends from the annular portion 642 toward a side surface of the filter block 610. As illustrated in FIG. 12C, each connecting portion 644 has a portion on the upper surface side thereof half-etched and has the thickness thereof formed thinner than that of the annular portion 642.

The annular portion 642 only has to have a shape surrounding the optical filter 612, and examples of the shape include a shape in which a portion of an annular frame is removed. In FIG. 12A, the shape of the annular portion 642 of the frame member 640 when viewed in plan is formed into a shape in which a portion of a polygonal annular shape is removed (a letter C shape). In the present embodiment, an inner side portion of the letter C shape in which the optical filter 612 is arranged is defined as the "opening h1".

The frame member 640 has portions of the frame member 640 (upper surface and end surfaces of the connecting portions 644) exposed from the sealing member 620 on an upper surface 610a and side surfaces 610b of the filter block 610. That is, the sealing member 620 seals the sidewall surfaces (the inner wall surfaces and the outer wall surfaces) and the bottom surface of the annular portion 642 of the frame member 640 and a part of the connecting portions 644 of the frame member 640.

The frame member 640 is preferably a member with low emissivity, for example, a member with an emissivity of 0.3 or less. Examples of a member with low emissivity include a metal, specifically copper, silver, gold, platinum, nickel, palladium, or the like.

Optical Filter

The optical filter 612 has a function of transmitting light within a desired wavelength range selectively (that is, with high transmittance). The optical filter 612 has a function of, for example, transmitting only infrared rays. As a material of which an optical member constituting the optical filter 612 is made, a material, such as silicon (Si), glass ($SiO_2$), sapphire ($Al_2O_3$), Ge, ZnS, ZnSe, $CaF_2$, and $BaF_2$, that transmits light within a preset wavelength range is used. In addition, the optical filter 612 may have a configuration in which a thin film is formed on an optical member by vapor deposition or the like. As a thin film material, silicon (Si), glass ($SiO_2$), sapphire ($Al_2O_3$), Ge, ZnS, $TiO_2$, $MgF_2$, $SiO_2$, $ZrO_2$, $Ta_2O_5$, or the like is used.

In addition, the optical filter 612 may be a dielectric multilayer film filter that is formed by stacking dielectric materials having different refractive indices in a multilayer form on an optical member. In this case, the dielectric layers stacked in a multilayer form are formed on a single surface or both surfaces of the optical member. When the dielectric layers are formed on both surfaces of the optical member, the dielectric layers may be formed with different thicknesses between the front surface and the reverse surface of the optical member.

The filter block 610 is formed by arranging optical filters 612 in the openings h1 of frame members 640 stuck on a heat resistant adhesive sheet, followed by sealing the frame members 640 and the optical filters 612 with a resin material, such as an epoxy resin, and thereby forming sealing members 620, and separating the sealed frame members 640 and optical filters 612 into individual pieces. The filter block 610 is connected to the optical device 100 by applying, as an adhesive, for example, thermosetting resin in a region other than the photoelectric conversion element 10 on the upper surface (a surface on the light incident surface 10a side) of the optical device 100 and arranging the filter block 610, followed by curing the adhesive by heat treatment or the like.

Variation of Sixth Embodiment

Although, in the sixth embodiment, an example in which the optical device 600 includes the filter block 610 as an example of an optical member block was described, the present invention is not limited to such a configuration.

Figure 13A:
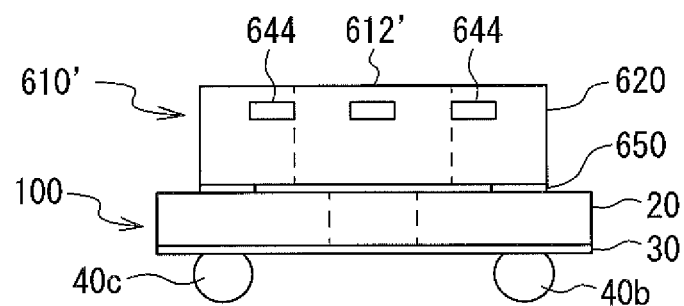
FIGS. 13A and 13B are schematic views illustrative of a configuration example of an optical device with lens block according to a variation of the sixth embodiment of the present invention.
Figure 13B:
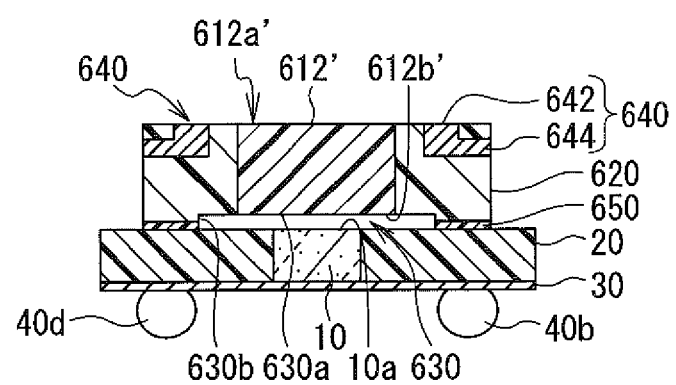

For example, as illustrated in FIGS. 13A and 13B, in an optical device 600' according to a variation of the sixth embodiment, a lens block 610' maybe used in place of the filter block 610 of the optical device 600 according to the sixth embodiment. FIGS. 13A and 13B are a side view and a cross-sectional view of the optical device 600', respectively.

The lens block 610' includes, in place of the optical filter 612, an optical lens chip (hereinafter, referred to as an optical lens) 612'. Note that the lens block 610' may be, as with the filter block 610, applied to the optical device 200 according to the second embodiment to the optical device 500 according to the fifth embodiment.

In the optical device 600', light is incident on a photoelectric conversion element 10 of an optical device 100 through the optical lens 612' in the lens block 610' and is detected.

Hereinafter, a configuration of the optical lens 612' will be described. Note that, since the constituent elements other than the optical lens 612' of the lens block 610' are the same as the constituent elements other than the optical filter 612 of the filter block 610 described in the above-described sixth embodiment, descriptions thereof will be omitted.

Optical Lens

The optical lens 612' is a lens made of, for example, silicon or germanium and is a spherical lens, an aspheric lens, a Fresnel lens, or a binary lens. The optical lens 612' preferably has a lens surface formed on one surface of the optical lens 612' serving as a light incident surface and a surface on the opposite side to the lens surface formed into a flat surface. In order to make the optical device 600' thinner, the optical lens 612' is preferably, for example, a Fresnel lens or a binary lens.

Figure 14A:
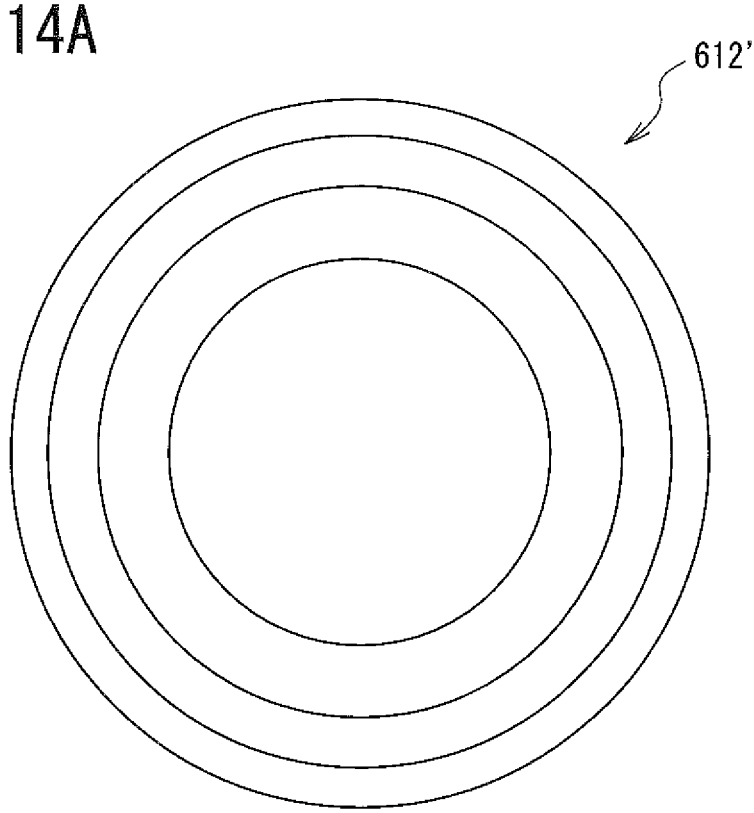
FIGS. 14A to 14C are schematic views illustrative of a configuration example of a lens that is used in the optical device with lens block according to the variation of the sixth embodiment of the present invention.
Figure 14B:
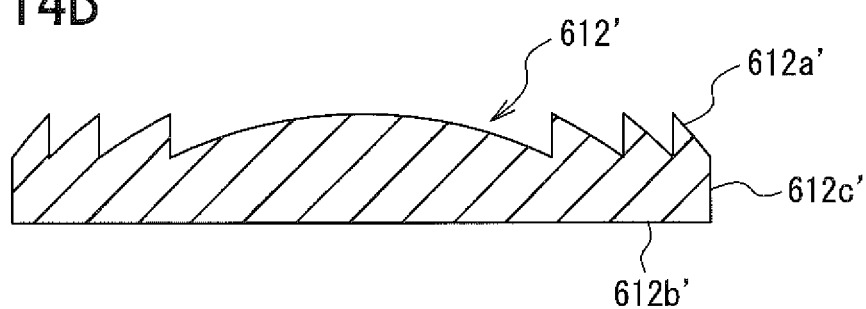

Using FIGS. 14A to 14C, the optical lens 612' will be described. FIGS. 14A and 14B are a plan view (a diagram illustrative of a lens surface) of a Fresnel lens that is an example of the optical lens 612' and a cross-sectional view illustrative of a cross-section of the Fresnel lens illustrated in FIG. 14A. In addition, FIG. 14C is a cross-sectional view illustrative of a cross-section of a binary lens that is another example of the optical lens 612'.

The lens surface of the optical lens 612' is formed on the side on which one surface (the upper surface of the optical lens 612' illustrated in FIG. 13B) 612a' of the optical lens 612' is located. The optical lens 612' may be, for example, a general Fresnel lens (FIG. 14B) the lens surface of which has, as a cross-sectional shape, a sawtooth cross-sectional shape of a blazed grating or a binary lens (FIG. 14C) the lens surface of which has, as a cross-sectional shape, a shape obtained by quantizing a sawtooth cross-sectional shape of a blazed grating. The "shape obtained by quantizing a sawtooth cross-sectional shape of a blazed grating" in a binary lens means a staircase shape in which a sawtooth cross-sectional shape of a blazed grating is approximated to a plurality of levels in a lens cross-section and, for example, means that a slope of a sawtooth is formed into a staircase shape including a plurality of (for example, four) stairs. A side surface 612c' of the optical lens 612' is covered by a sealing member 620.

The other surface (for example, the lower surface of the optical lens 612' illustrated in FIG. 13B) 612b' of the optical lens 612', which is not a lens surface, is formed into a flat surface. The lower surface 612b' of the optical lens 612' is, for example, smoothed by back grinding (BG) or polishing while the thickness of the optical lens 612' is adjusted.

Figure 14C:
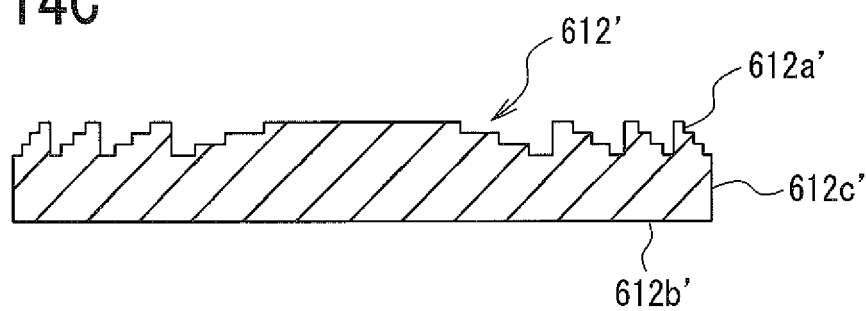
Figure 15A:
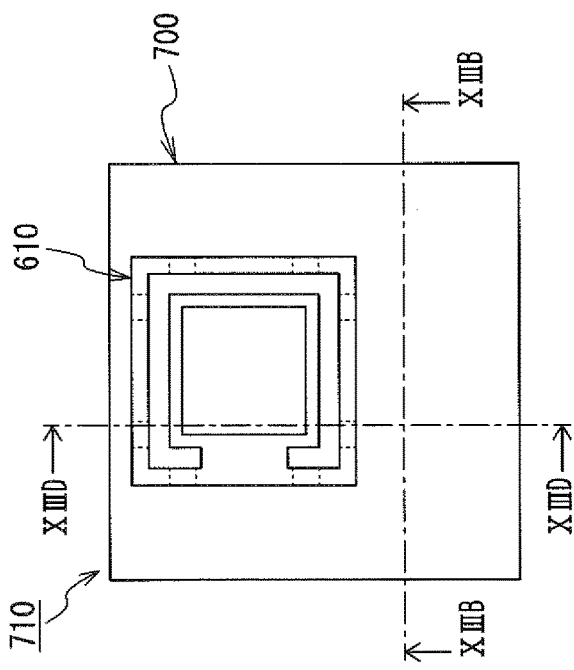
FIGS. 15A to 15D are schematic views illustrative of a configuration example of an optical device with filter block according to a seventh embodiment of the present invention.
Figure 15B:
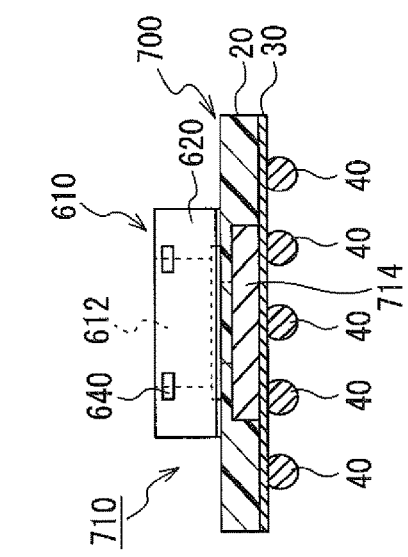
Figure 15C:
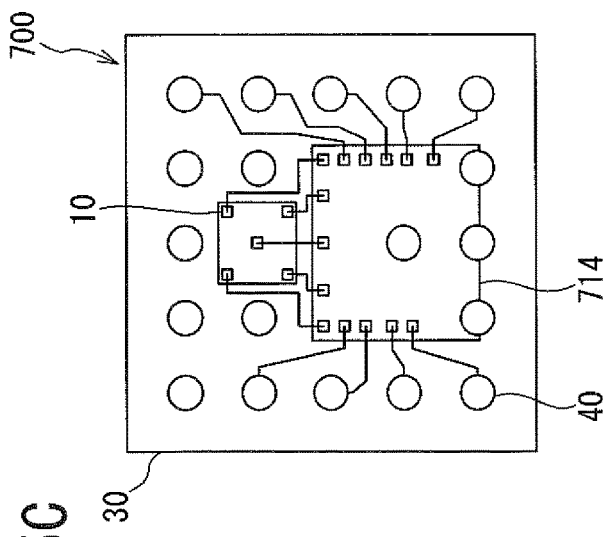
Figure 15D:
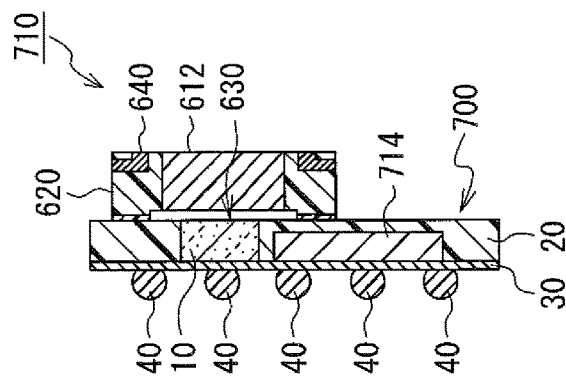

Although, in FIGS. 14A to 14C, an example in which a lens surface is formed on the upper surface 612a' of the optical lens 612' was described, the present invention is not limited to such a configuration. The lens surface may be formed on the lower surface 612b' of the optical lens 612'. In this case, a Fresnel lens or a binary lens is formed on the the lower surface 612b' of the optical lens 612' and the upper surface 612a' of the optical lens 612' is smoothed by back grinding (BG) or polishing.

In the optical device 600', the depth of a recessed portion 630 is determined by the focus of the lens.

Advantageous Effects of Sixth Embodiment

An optical device with optical member block according to the sixth embodiment has the following advantageous effect in addition to the advantageous effects (1) to (4) in the first embodiment.

(9) The optical device 600 with optical member block according to the sixth embodiment can be made thinner as a whole even when an optical member block is disposed because the optical device 100 including the photoelectric conversion element 10 is thin.

Note that, when the filter block is applied to the optical device 200 according to the second embodiment to the optical device 500 according to the fifth embodiment, advantageous effects in the second to fifth embodiments are attained, respectively.

7. Seventh Embodiment

Hereinafter, a seventh embodiment of the present invention will be described with reference to the drawings.

Configuration of Optical Device with Filter Block

Using FIGS. 15A to 15D with reference to FIGS. 1A to 4F, a configuration of an optical device 710 according to the seventh embodiment will be described. FIGS. 15A to 15D are configuration diagrams for a description of the optical device 710 according to the seventh embodiment, and FIGS. 15A, 15B, 15C, and 15D are a plan view illustrative of a configuration example of the optical device 710, a cross-sectional view schematically illustrative of a cross-section taken along the line XIIIB-XIIIB of FIG. 15A, a bottom view illustrative of the configuration example of the optical device 710, and a cross-sectional view schematically illustrative of a cross-section taken along the line XIIID-XIIID of FIG. 15A, respectively.

The optical device 710 according to the seventh embodiment differs from the optical device 600 of the sixth embodiment in including, in place of the optical device 100, an optical device 700 in which an IC chip 714 is sealed in conjunction with a photoelectric conversion element 10. That is, the optical device 710 is an optical device 710 with filter block in which a filter block 610 according to the sixth embodiment is connected to the optical device 700 in which the photoelectric conversion element 10 and the IC chip 714 are sealed.

The IC chip 714 includes a driving circuit of the photoelectric conversion element 10 or a signal processing circuit configured to process a signal from the photoelectric conversion element 10. In the optical device 710, light is incident on a photoelectric conversion element 10 of the optical device 700 through an optical filter 612 in the filter block 610 and is detected. In addition, the optical device 700 has a function of processing a signal based on detected light within the optical device 700 and outputting the processed signal.

Since the constituent elements other than the IC chip 714 are the same as those in the above-described sixth embodiment, descriptions thereof will be omitted.

IC Chip

The IC chip 714 is covered by a sealing portion 20 in conjunction with the photoelectric conversion element 10. The IC chip 714 is electrically coupled to the photoelectric conversion element 10 via, for example, a redistribution layer 30 and includes a signal processing circuit, such as a detection circuit configured to detect current from the photoelectric conversion element 10. Note that, when the optical device 700 is an optical device 400 or 500 that includes a light emitting portion 112*b* illustrated in the fourth or fifth embodiment, the IC chip 714 includes a driving circuit of the photoelectric conversion element 10. The IC chip 714 is electrically coupled to the redistribution layer 30 and outputs a processed signal to a circuit formed on a not-illustrated circuit board via the redistribution layer 30 and external connection terminals 40.

The optical device 700 including the IC chip 714 described above is obtained by, in, for example, a process illustrated in FIG. 4B in the first embodiment, adhering the IC chip 714 in conjunction with the photoelectric conversion element 10 in the form of an individual piece on an adhesive film 212 and forming the sealing portion 20.

Advantageous Effects of Seventh Embodiment

An optical device with filter block according to the seventh embodiment has the following advantageous effect in addition to the advantageous effects (1) to (4) in the first embodiment.

(10) The optical device 710 according to the seventh embodiment can be made thinner as a whole even when the filter block 610 is disposed because the optical device 700 including the photoelectric conversion element 10 is thin.

Note that, when the filter block is applied to the optical device 200 according to the second embodiment to the optical device 500 according to the fifth embodiment, advantageous effects in the second to fifth embodiments are attained, respectively.

The scope of the present invention is not limited to the illustrated and described exemplary embodiments, but includes all embodiments that provide the same effects as those intended by the present invention. Further, the scope of the present invention is not limited to the combinations of features of the invention defined by the claims, but may be defined by any desired combination of particular features among all the disclosed features.

REFERENCE SIGNS LIST

10, 410 Photoelectric conversion element
10*a* Light incident surface
10*b* Electrode-formed surface
20 Sealing portion
30 Redistribution layer
31 Insulating layer
32 Redistribution
32*a*, 232*a*, 332*a*, 432*a*, 532*a* First redistribution
32*b*, 232*b*, 332*b*, 432*b*, 532*b* Second redistribution
432*c*, 532*c* Third redistribution
432*d*, 532*d* Fourth redistribution
33*a*, 33*b*, 33*c*, 33*d*, 33*e* Pad
34*a*, 34*b*, 234*a*, 234*b*, 334*a* to 334*d*, 434*a* to 434*d*, 534 Reflecting portion
40, 40*a*, 40*b*, 40*c*, 40*d* External connection terminal
40*e* Terminal
100, 200, 300, 400, 500, 600, 700, 710 Optical device
111 Semiconductor substrate
112 Semiconductor layer
112*a* Light receiving portion
112*b* Light emitting portion
113, 113*a*, 113*b*, 113*c*, 113*d* Electrode
311 First insulating layer
312 Second insulating layer
610 Filter block
612 Optical filter chip (optical filter)
612*a* Light incident surface
612*b* Light emitting surface
620 Sealing member
640 Frame member
642 Annular portion
644 Connecting portion
650 Connecting member
714 IC chip

The invention claimed is:

1. An optical device comprising:
a photoelectric conversion element configured to include a semiconductor substrate, a semiconductor layer formed on one principal surface of the semiconductor substrate and capable of receiving or emitting light, and electrodes formed on the semiconductor layer;
a sealing portion configured to cover a side surface of the photoelectric conversion element in such a way as to expose a surface of the photoelectric conversion element on the opposite side to an electrode-formed surface of the photoelectric conversion element on which the electrodes are formed;
a redistribution layer configured to include an insulating layer disposed on the electrode-formed surface of the photoelectric conversion element, redistributions coupled to the electrodes, and a reflecting portion disposed in a region in which, when viewed in plan, the semiconductor layer and the electrodes do not overlap each other and configured to reflect the light to a side on which the semiconductor layer is located; and
external connection terminals configured to be disposed on the redistribution layer and coupled to the redistributions.

2. The optical device according to claim 1, wherein the reflecting portion is portions of the redistributions.

3. The optical device according to claim 1, wherein the reflecting portion has, when viewed in plan, a shape the width of which widens from the electrodes toward external connection terminals.

4. The optical device according to claim 1, wherein the reflecting portion electrically couples each of the electrodes to a plurality of external connection terminals among the external connection terminals.

5. The optical device according to claim 1, wherein the reflecting portion is not electrically coupled to the electrodes and is disposed at the same layer as at least portions of the redistributions separately from the redistributions.

6. The optical device according to claim 1, wherein the reflecting portion is, when viewed in plan, arranged in such a way as to cover a region occupying 10% or more of area of the semiconductor layer.

7. The optical device according to claim 1, wherein the reflecting portion is, when viewed in plan, arranged in such a way as to cover a region occupying 10% or more of a region in which the semiconductor layer and the electrodes do not overlap each other.

8. The optical device according to claim 1, wherein the semiconductor substrate has optical transparency.

9. The optical device according to claim 1 comprising
an IC chip configured to be electrically coupled to the photoelectric conversion element,
wherein the IC chip is covered by the sealing portion.

10. The optical device according to claim 9, wherein the IC chip includes a driving circuit configured to supply the photoelectric conversion element with current and/or a detection circuit configured to detect current from the photoelectric conversion element.

11. The optical device according to claim 1 comprising
an optical member block configured to include an optical member and a sealing member covering a side surface of the optical member, wherein a recessed portion is formed by one surface of the optical member and the sealing member, at least a portion of a bottom surface of the recessed portion is formed by the one surface of the optical member, and a sidewall of the recessed portion is formed by the sealing member,
wherein the optical member block is arranged in such that the recessed portion covers an exposed surface of the photoelectric conversion element on the opposite side to an electrode-formed surface of the photoelectric conversion element on which the electrodes are formed.

12. The optical device according to claim 11, wherein the optical member is an optical filter configured to control wavelength of transmitted light.

13. The optical device according to claim 11, wherein the optical member is an optical lens configured to control a direction of transmitted light.

14. A method for manufacturing an optical device comprising:
forming a first insulating layer on a surface on an electrode side of a photoelectric conversion element configured to include a semiconductor substrate, a semiconductor layer formed on one principal surface of the semiconductor substrate and capable of receiving or emitting light, and electrodes formed on the semiconductor layer in such that the electrodes are exposed;
forming a redistribution layer electrically coupled to the electrodes, and a reflecting portion on a region in which, when viewed in plan, the semiconductor layer and the electrodes do not overlap each other;
forming a second insulating layer in such that portions of the redistribution layer are exposed; and
forming external connection terminals on the exposed portions of the redistribution layer.

* * * * *